United States Patent
Yamamura et al.

(10) Patent No.: US 6,487,682 B2
(45) Date of Patent: Nov. 26, 2002

(54) SEMICONDUCTOR INTEGRATED CIRCUIT

(75) Inventors: Takeshi Yamamura, Kawasaki (JP);
Tadahiro Saitoh, Kawasaki (JP);
Kazuhiro Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 07/946,538

(22) Filed: Sep. 17, 1992

(65) Prior Publication Data

US 2002/0049927 A1 Apr. 25, 2002

(30) Foreign Application Priority Data

Sep. 18, 1991 (JP) ............................................. 3-238410
Sep. 19, 1991 (JP) ............................................. 3-240010
Sep. 20, 1991 (JP) ............................................. 3-241046
Oct. 2, 1991 (JP) ............................................. 3-254954

(51) Int. Cl.[7] ............................................. G01R 31/28
(52) U.S. Cl. ............................. 714/30; 716/1; 714/25; 714/27; 714/724; 714/726; 714/729
(58) Field of Search .................................. 364/488, 489, 364/490; 371/22.3; 714/25, 27, 30, 724, 726, 729; 716/1

(56) References Cited

U.S. PATENT DOCUMENTS

| T944,007 | I4 | * | 3/1976 | Booth, Jr. et al. | ...... 364/490 X |
| 4,819,166 | A | * | 4/1989 | Si et al. | .................. 371/22.3 X |
| 5,109,190 | A | * | 4/1992 | Sakashita et al. | ...... 371/22.3 X |

(List continued on next page.)

FOREIGN PATENT DOCUMENTS

| DE | A-37 15 116 | 11/1987 |
| FR | 2 508 255 | 12/1982 |
| JP | 57-133644 | 8/1982 |

(List continued on next page.)

OTHER PUBLICATIONS

Scheiber: "Test tactics for partial–scan boards", Test & Measurement World, Apr. 1991, vol. 11, No. 5, pp. 69–70, 72, 74, 76 78, (Abstract Only).*
Hatfield et al: "Motorola and Schumberger Announce Major Partnership to Develop Semiconductor Test Equipment in the U.S."; Businee Wire (San Francisco, CA US); May 31, 1989, section 1, p. 1.*
Copy of Notification of Reason(s) for Refusal for corresponding Japanese Patent Application No. 3–254954 dated Oct. 18, 2000 with translation.
Copy of Decision of Refusal for corresponding Japanese Patent Application No. 3–241046 dated Feb. 7, 2000 with translation.

(List continued on next page.)

Primary Examiner—Edward R. Cosimano
(74) Attorney, Agent, or Firm—Armstrong, Westerman & Hattori, LLP

(57) ABSTRACT

A semiconductor integrated circuit includes a semiconductor chip body, a plurality of input/output cells arranged on a surface of the semiconductor chip body at parts including a peripheral part and a central part the semiconductor chip body, and at least an internal logic circuit provided on the semiconductor chip body. Each of the input/output cells include a pad and a holding circuit coupled to the pad for holding incoming data. A plurality of holding circuits are coupled in series in a test mode to form a scan path circuit. The input/output cell which has the pad for receiving an external test signal in a test mode is arranged at the peripheral part of the semiconductor chip body, and the test data held in the holding circuit of the input/output cell which is arranged at a part other than the peripheral part of the semiconductor chip body is transferred to the internal logic circuit in the test mode.

32 Claims, 30 Drawing Sheets

U.S. PATENT DOCUMENTS

| | | | | |
|---|---|---|---|---|
| 5,220,282 A | * | 6/1993 | Matsuki | 371/22.3 X |
| 5,426,650 A | * | 6/1995 | Ganapathy et al. | 714/731 |
| 5,477,545 A | * | 12/1995 | Haung | 714/727 |
| 5,487,074 A | * | 1/1996 | Sullivann | 714/727 |
| 5,623,501 A | * | 4/1997 | Cooke et al. | 714/725 |
| 5,636,277 A | * | 6/1997 | Segars | 714/729 |

FOREIGN PATENT DOCUMENTS

| | | |
|---|---|---|
| JP | 60-34036 | 2/1985 |
| JP | 60 49648 | 3/1985 |
| JP | 60-82871 | 5/1985 |
| JP | 60 034 036 | 6/1985 |
| JP | 60 136 241 | 11/1985 |
| JP | 60-234341 | 11/1985 |
| JP | 60-242380 | 12/1985 |
| JP | 60-251643 | 12/1985 |
| JP | 61-43464 | 3/1986 |
| JP | 61-54470 | 3/1986 |
| JP | 61 179 577 | 1/1987 |
| JP | 62-126371 | 6/1987 |
| JP | 62-154775 | 7/1987 |
| JP | 62-155549 | 7/1987 |
| JP | 62-155550 | 7/1987 |
| JP | 62-195169 | 8/1987 |
| JP | 62-224056 | 10/1987 |
| JP | 62 179 742 | 1/1988 |
| JP | 63-108747 | 5/1988 |
| JP | 63-243890 | 10/1988 |
| JP | 63-300528 | 12/1988 |
| JP | 01 259 560 | 1/1989 |
| JP | 1-86536 | 3/1989 |
| JP | 1-134280 | 5/1989 |
| JP | 2-26043 | 1/1990 |
| JP | 2-105468 | 4/1990 |
| JP | 3-30452 | 2/1991 |
| JP | 3-72281 | 3/1991 |
| JP | 3-165533 | 7/1991 |
| JP | 3 203 363 | 9/1991 |
| JP | 5-21556 | 1/1993 |
| JP | 5-347340 | 12/1993 |
| JP | 06-160489 | * 6/1994 |

OTHER PUBLICATIONS

Copy of Notification of Reason(s) for Refusal for corresponding Japanese Patent Application No. 3–241046 dated Aug. 18, 1999 with translation.

Copy of Notification of Reason(s) for Refusal for corresponding Japanese Patent Application No. 3–238410 dated Apr. 23, 2001 with translation.

IBM Technical Disclosure Bulletin, vol. 27, No. 9, Feb. 1985, pp. 5347–5351.

IBM Technical Disclosure Bulletin, vol. 22, No. 7, Dec. 1979, pp. 2772–2774.

Huang et al; "Scan Tests Provide Complete Fault Coverage in Prototype ASICs", Electronics Test, vol. 11, Oct. 10, 1988, pp. 71–79.

Hartley et al; "A Rapid–Prototyping Environment for Digital–Signal Processors"; IEEE Design & Test of Computers, vol. 8, No. 2, May 1991, pp. 11–26.

* cited by examiner

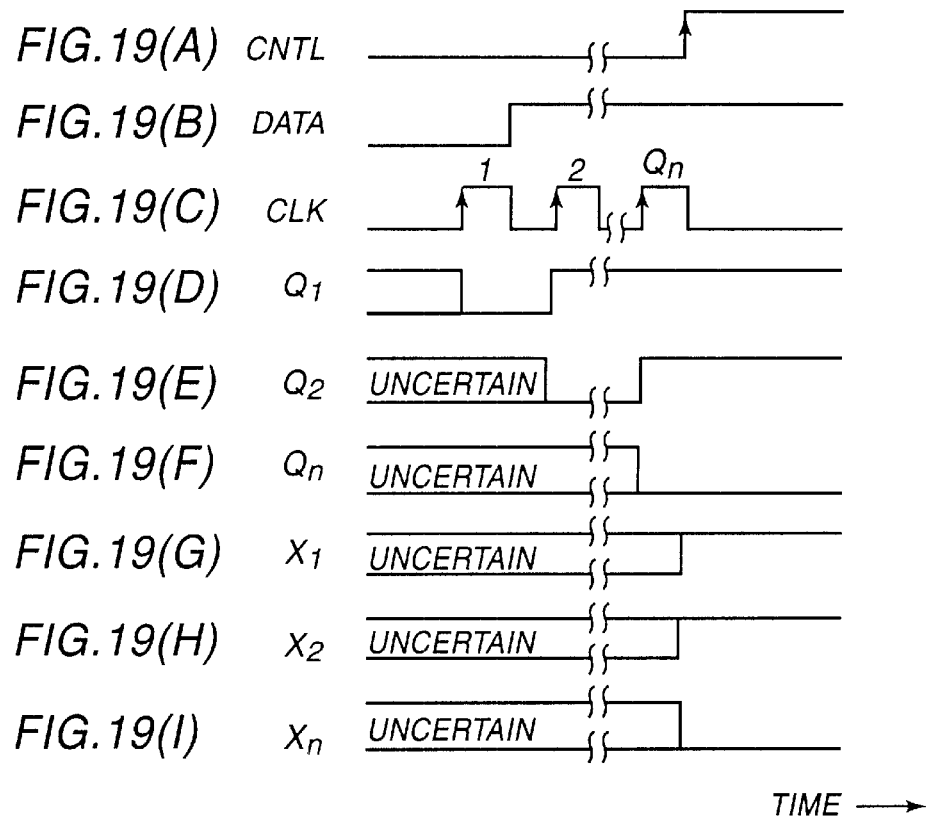
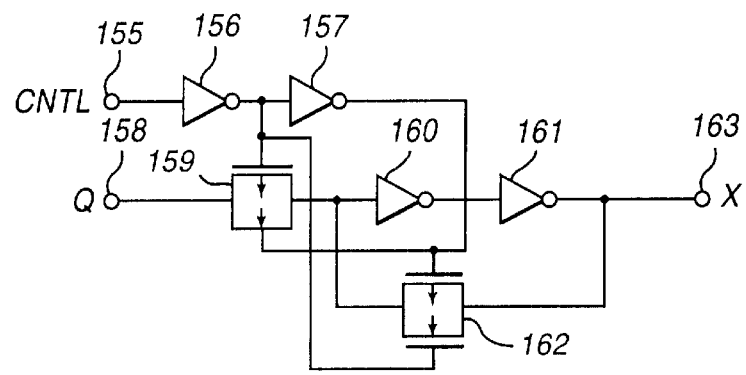

FIG. 24

SEMICONDUCTOR INTEGRATED CIRCUIT

BACKGROUND OF THE INVENTION

The present invention generally relates to semiconductor integrated circuits, and more particularly to a semiconductor integrated circuit having a scan path circuit which uses a scan-in/out system.

Semiconductor technology has developed considerably over the recent years, and the integration density of semiconductor integrated circuits such as large scale integrated circuits (LSIs) and very large scale integrated circuits (VLSIs) has improved. Due to the increase in the integration density of the semiconductor integrated circuits, the number of terminals for data input/output has increased, and the number of input/output cells for data input/output has also increased. For this reason, it is impossible to secure the required number of input/output cells by the method of arranging the input/output cells only in a peripheral part of a chip of the semiconductor integrated circuit, and the input/output cells are now being arranged on the entire surface of the chip of the semiconductor integrated circuit. However, when the input/output cells are arranged on the entire surface of the chip, it is difficult to carry out a test which uses a prober.

On the other hand, as the integration density of the semiconductor integrated circuit increases, it becomes more and more difficult to make a diagnosis regarding whether or not the semiconductor integrated circuit operates as originally designed. As a result, there is a problem in that the cost involved in testing the semiconductor integrated circuit increases. Accordingly, there are demands to realize a semiconductor integrated circuit which can facilitate the test and reduce the cost involved in testing the semiconductor integrated circuit.

In the LSI production process, it is necessary to confirm the performance of the LSI. The test which is carried out to confirm the performance of the LSI can generally be divided into a test which is carried out at the development stage and a test which is carried out at the mass production stage. As the circuit test which is carried out at the mass production stage, there is a wafer probing test which is carried out at the end stage of the wafer process in order to reduce the defective chip mixture rate to the assembling process.

According to the wafer probing test, tip ends of needles 14 of the prober (not shown) make contact with corresponding pads 15 of input/output cells 11 which are arranged on an LSI chip 10 as shown in FIG. 1, and the electrical characteristics of the LSI chip 10 are checked by use of a signal generator, a waveform analyzer and the like which are coupled to the prober. As a result, it is possible to check not only the operation of the LSI chip 10 but also the transmission delay time, the rise time, the fall time and the like of signals. The LSI chip 10 which is found to be defective as a result of this wafer probing test is automatically marked as a defective chip and is excluded from the subsequent assembling process. Hence, the chips which are found to be defective after the assembling process are only those which are generated in the assembling process, and it is possible to considerably improve the production yield and production cost of the LSI.

Conventionally, the integration density of the LSI chip 10 is not extremely high and the number of input/output cells 11 is not extremely large. For this reason, the input/output cells 11 are provided at the outer peripheral end region of the LSI chip 10, that is, at the peripheral part of the LSI chip 10. Accordingly, it was sufficient to arrange the prober needles 14 which are required for the wafer probing test only at the peripheral part of the LSI chip 10.

But recently, due to the improved integration density of LSIs, it has become necessary to arrange the input/output cells for data input/output also at the inner part of the LSI chip. In order to carry out the wafer probing test similarly to the conventional case described above, it is necessary to arrange the prober needles 14 which are required for the wafer probing test so as to make contact with the pads 15 of all of the input/output cells 11 within an LSI chip 10A, as shown in FIG. 2. However, it is difficult to make a prober which has the prober needles 14 arranged to make contact with the pads 15 of all of the input/output cells 11 shown in FIG. 2, and even if were possible to make such a prober, there are problems in that the prober would become expensive and the contact accuracy of the prober needles 14 would become poor. In addition, the testing equipment must be provided with a large number of terminals for supplying the signals to all of the input/output cells 11, and there is a problem in that the cost of the testing equipment itself becomes high.

SUMMARY OF THE INVENTION

Accordingly, it is a general object of the present invention to provide a novel and useful semiconductor integrated circuit in which the problems described above are eliminated.

Another and more specific object of the present invention is to provide a semiconductor integrated circuit comprising a semiconductor chip body, a plurality of input/output cells arranged on a surface of the semiconductor chip body at parts including a peripheral part and a central part of the semiconductor chip body, and at least an internal logic circuit provided on the semiconductor chip body, where each of the input/output cells include a pad and holding means coupled to the pad for holding incoming data, a plurality of the holding means are coupled in series in a test mode to form a scan path circuit, the input/output cell which has the pad for receiving an external test signal in a test mode is arranged at the peripheral part of the semiconductor chip body, and the test data held in the holding means of the input/output cell which is arranged at a part other than the peripheral part of the semiconductor chip body is transferred to the internal logic circuit in the test mode. According to the semiconductor integrated circuit of the present invention, it is possible to use a prober and a testing equipment which are similar to those conventionally used. Therefore, the prober needles can accurately contact the required pads and the testing can be carried out with ease using inexpensive prober and testing equipment which have simple constructions.

Still another object of the present invention is to provide the semiconductor integrated circuit of the type described above wherein predetermined ones of the input/output cells having the pads for receiving an external signal and outputting a signal outside the semiconductor integrated circuit are arranged in the peripheral part of the semiconductor chip body, and the holding means which are coupled to form the scan path circuit include a first shift register for shifting the test data which is received from the input/output cell having the pad for receiving the external test signal in the test mode. According to the semiconductor integrated circuit of the present invention, it is possible to test the semiconductor integrated circuit by simply contacting the prober needles to those pads which are arranged in the peripheral part of the semiconductor integrated circuit.

A further object of the present invention is to provide the semiconductor integrated circuit of the type described first, wherein predetermined ones of the input/output cells having the pads for receiving an external signal and outputting a signal outside the semiconductor integrated circuit are arranged in the peripheral part of the semiconductor chip body, first input/output cells are arranged in the peripheral part of the semiconductor chip body, second input/output cells are arranged in the central part of the semiconductor chip body, each first input/output cell is used for a data transfer between the semiconductor integrated circuit and another semiconductor integrated circuit which is independent from the semiconductor chip body, and each second input/output cell is primarily used for a data transfer within the semiconductor integrated circuit. According to the semiconductor integrated circuit of the present invention, it is possible to minimize the deterioration of the integration density of the internal logic circuit due to the provision of the input/output cells and effectively utilize the surface of the semiconductor chip body.

Another object of the present invention is to provide the semiconductor integrated circuit of the type described first, wherein the semiconductor chip body includes a substrate, and the semiconductor integrated circuit further comprises a pair of lower conductor layers formed on the substrate and coupled to mutually different logic circuits within the semiconductor integrated circuit, and an upper conductor layer which is formed on the pair of lower conductor layers to short-circuit the pair of lower conductor layers, where the upper conductor layer forms the pad of the input/output cell. According to the semiconductor integrated circuit of the present invention, no boundary scan chain is established if a conduction failure, a short-circuit and the like occurs within the pad or in a vicinity of the pad. Hence, it is unnecessary to contact the prober needles to all of the pads in order to test the conduction test and the like within the pad or in the region in the vicinity of the pad. As a result, as long as the bonding is possible, there is no other limits to reducing the intervals of the pads, and the pads can be arranged using an arbitrary layout which efficiently utilizes the surface of the semiconductor chip body. Therefore, the integration density of the semiconductor integrated circuit can be improved.

Still another object of the present invention is to provide a semiconductor integrated circuit comprising a semiconductor chip body, a plurality of input/output cells arranged on a surface of the semiconductor chip body, and at least an internal logic circuit provided on the semiconductor chip body, where the input/output cells include first input/output cells which are arranged in a peripheral part of the semiconductor chip body and second input/output cells which are arranged in a central part of the semiconductor chip body, each first input/output cell is used for a data transfer between the semiconductor integrated circuit and another semiconductor integrated circuit which is independent from the semiconductor chip body, and each second input/output cell is primarily used for a data transfer within the semiconductor integrated circuit. According to the semiconductor integrated circuit of the present invention, it is possible to minimize the deterioration of the integration density of the internal logic circuit due to the provision of the input/output cells and effectively utilize the surface of the semiconductor chip body.

Other objects and further features of the present invention will be apparent from the following detailed description when read in conjunction with the accompanying drawings.

BRIEF DESCRIPTION OF THE DRAWINGS

FIGS. 19(A)–19(I) are timing diagrams, for explaining the operation of the circuit shown in FIG. 18;

FIG. 20 is a circuit diagram showing an embodiment of a latch circuit shown in FIG. 18;

FIG. 24 is a plan view generally showing the concept of a third embodiment of the semiconductor integrated circuit according to the present invention;

DESCRIPTION OF THE PREFERRED EMBODIMENTS

A description will be given of a first embodiment of a semiconductor integrated circuit according to the present invention, by referring to FIGS. 3 through 6. In this embodiment, the present invention is applied to an LSI chip.

Figure 1:
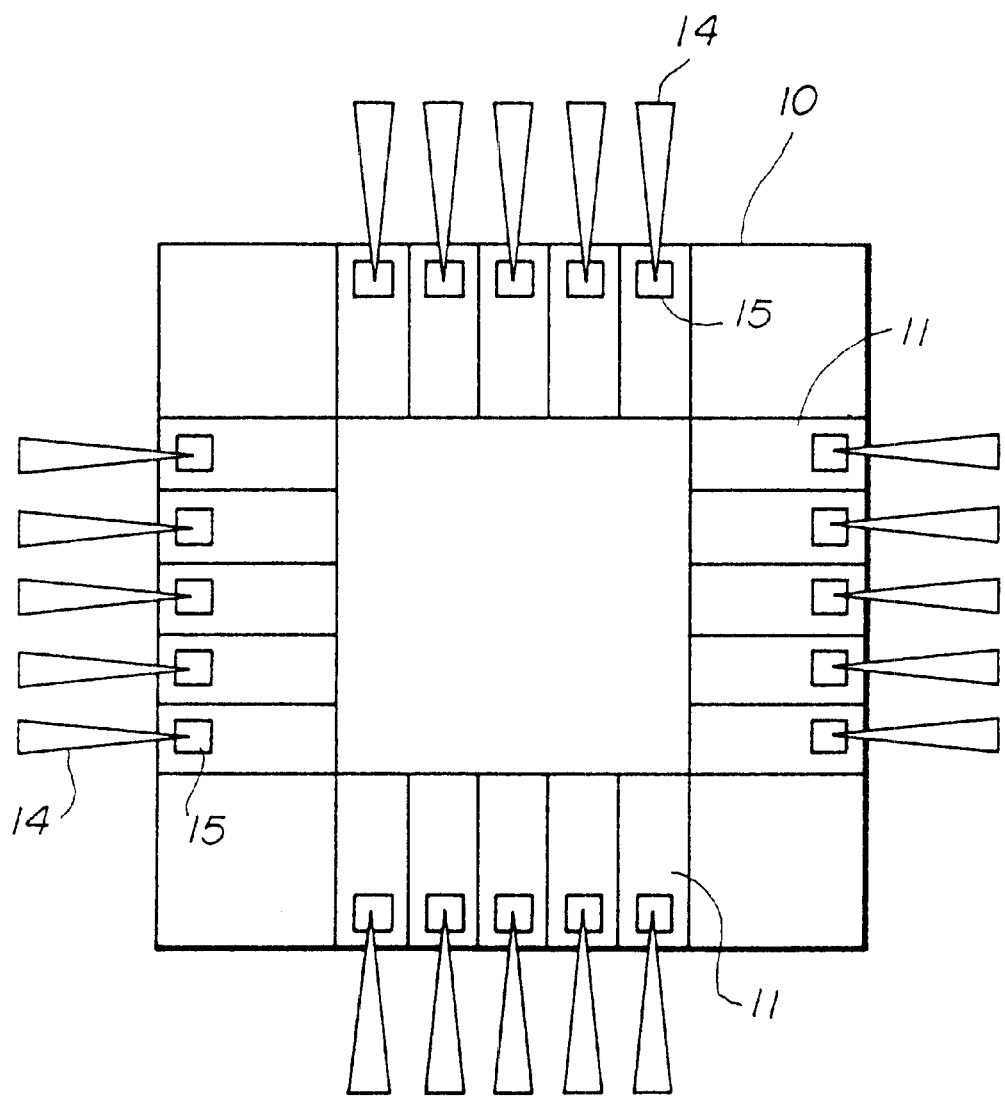
FIG. 1 is a diagram showing an LSI chip in a plan view for explaining an example of a conventional wafer probing test.
Figure 2:
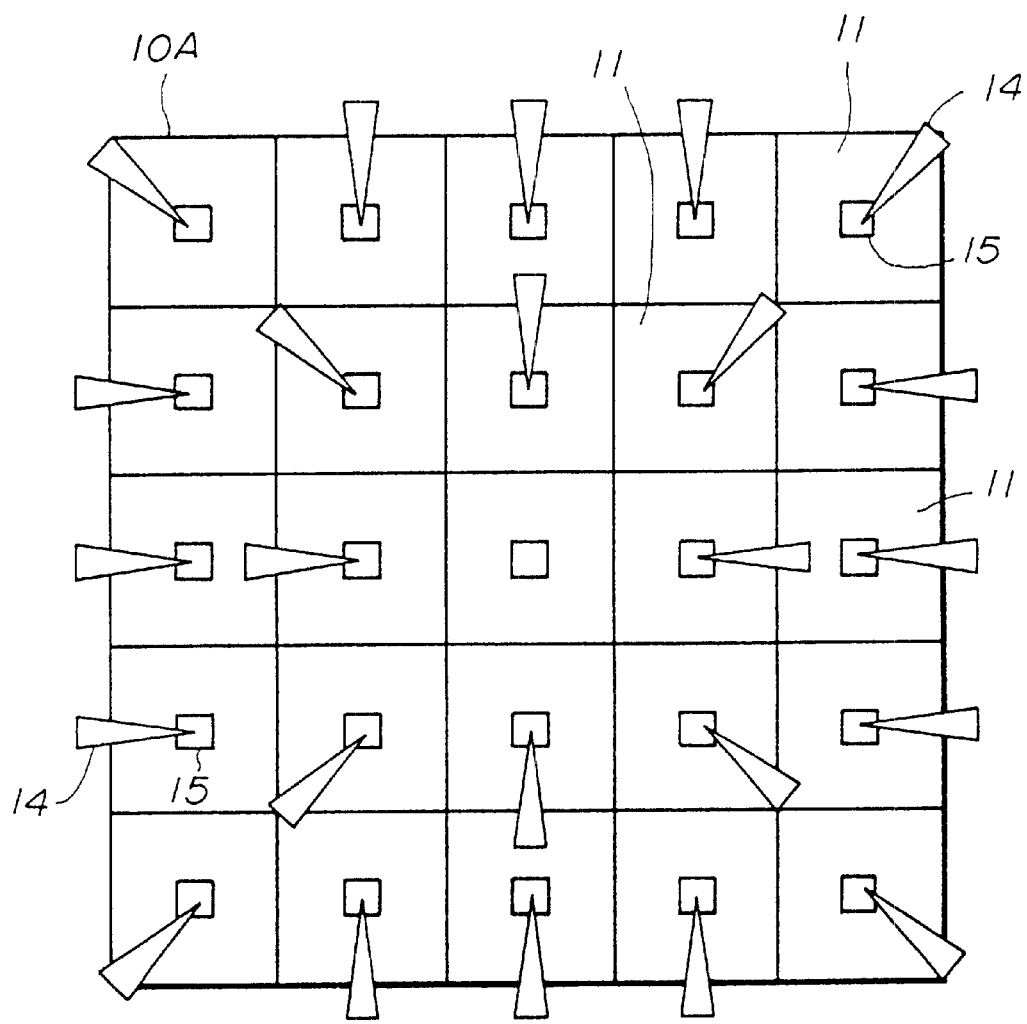
FIG. 2 is a diagram showing an LSI chip in a plan view for explaining another example of the conventional wafer probing test.
Figure 3:
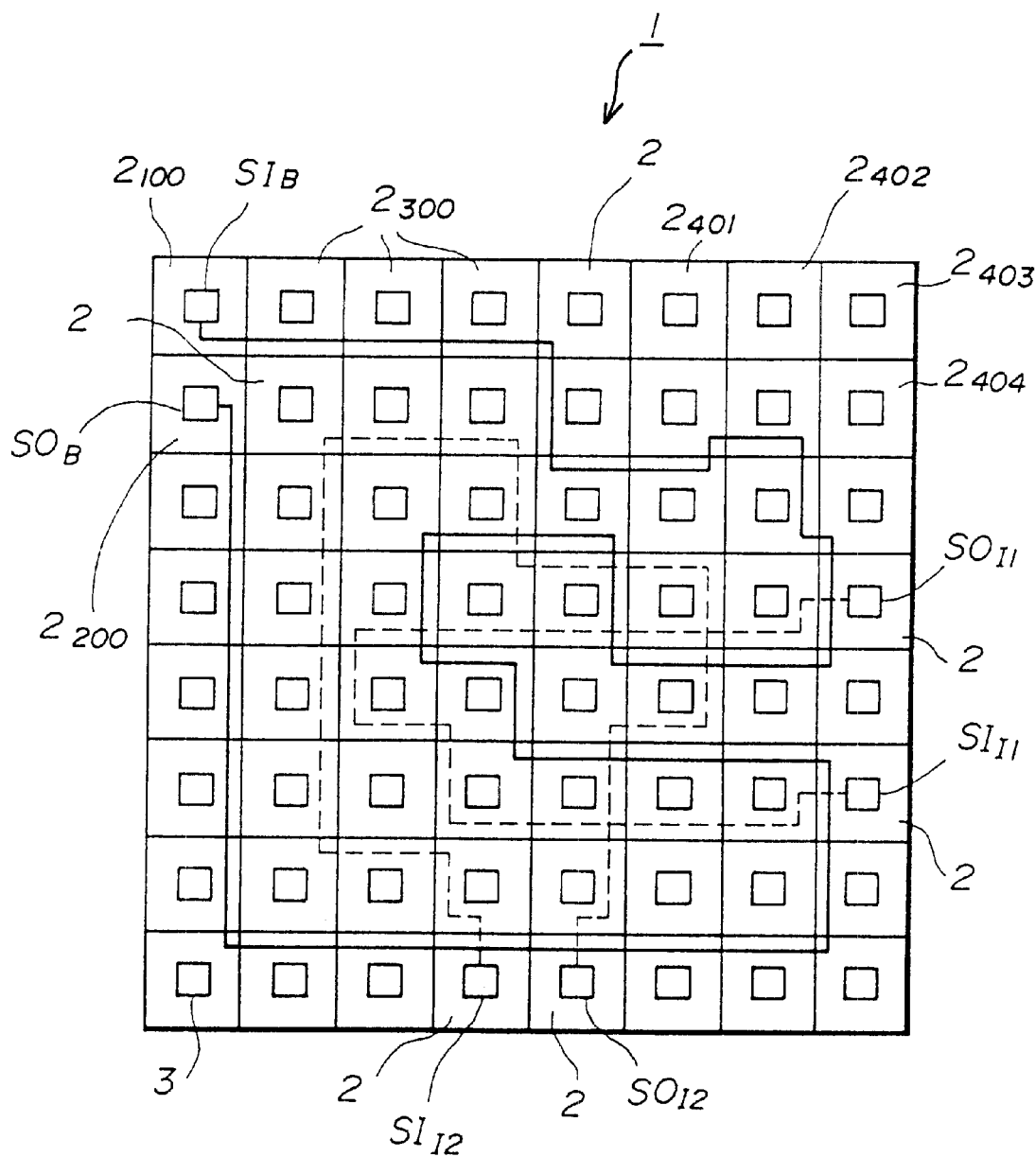
FIG. 3 is a plan view for explaining a first embodiment of a semiconductor integrated circuit according to the present invention.

FIG. 3 shows an LSI chip 1 having input/output cells 2 arranged on the surface of the LSI chip 1. Each input/output cell 2 is provided with a pad 3. The input/output cells 2 for scan-in/out are arranged in the outer peripheral end region of the LSI chip 1, that is, in the peripheral part of the LSI chip 1. The pad 3 of the input cell 2 for scan-in is denoted by SI, while the pad 3 of the output cell for scan-out is denoted by SO. On the other hand, the input/output cells 2 for data input/output are arranged over the entire surface of the LSI chip 1. A boundary scan chain which is indicated by a bold line in FIG. 3 or an internal (logic) scan chain which is indicated by a dotted line in FIG. 3 is connected to each input/output cell 2 for scan-in/out as a scan path circuit. Of course, FIG. 3 only shows a part of the input/output cells 2 for scan-in/out.

The boundary scan which is one method of testing the LSI is originally intended to also confirm whether or not signal transfers are normally carried out between the LSIs. But in this embodiment, the boundary scan chain is used as a means of setting inputs to or reading outputs from those input/output cells 2 which cannot be contacted by the prober needles. In other words, the inputs to or the outputs from those input/output cells 2 which cannot be contacted by the prober needles are set or read out via the boundary scan chain.

Figure 4:
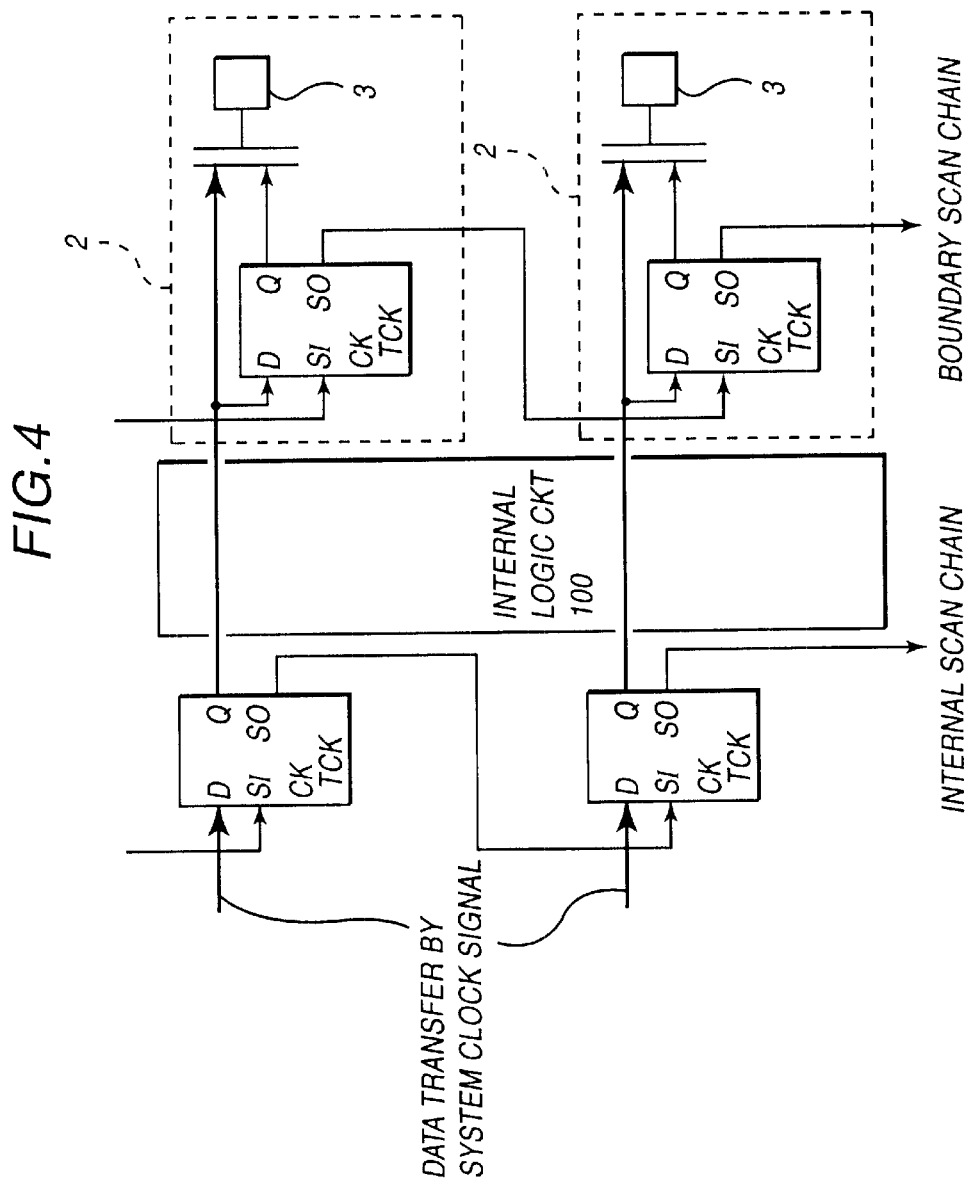
FIG. 4 is a circuit diagram for explaining a scan chain.

The boundary scan chain is a series loop which connects selected ones of a plurality of flip-flops (memory elements) existing in the input/output cells 2 which are arranged in the inner part of the LSI chip 1 by switching a mode signal to form a shift register, as shown in FIG. 4. When making the test, a test data having a logic value "1" or "0" is input from the scan-in pad 3 ($SI_B$) in synchronism with a scan clock signal, so as to successively write the test data into each flip-flop. By arbitrarily changing the content of the each flip-flop, it becomes possible to set each input/output cell 2 of the LSI chip 1 to an arbitrary state. On the other hand, when investigating the state of the input/output cell 2 of the LSI chip 1, a system clock signal is stopped so that the state of the input/output cell 2 will not change, and thereafter, the scan clock signal is input so as to output the state of the input/output cell 2 from the scan-out pad 3 ($SO_B$). Therefore, the input/output cells 2 for scan-in/out are arranged in the outermost peripheral part of the LSI chip 1, and the data is supplied to or is read from the input/output cells 2 located at the central part of the LSI chip 1 via the boundary scan chain.

Figure 5:
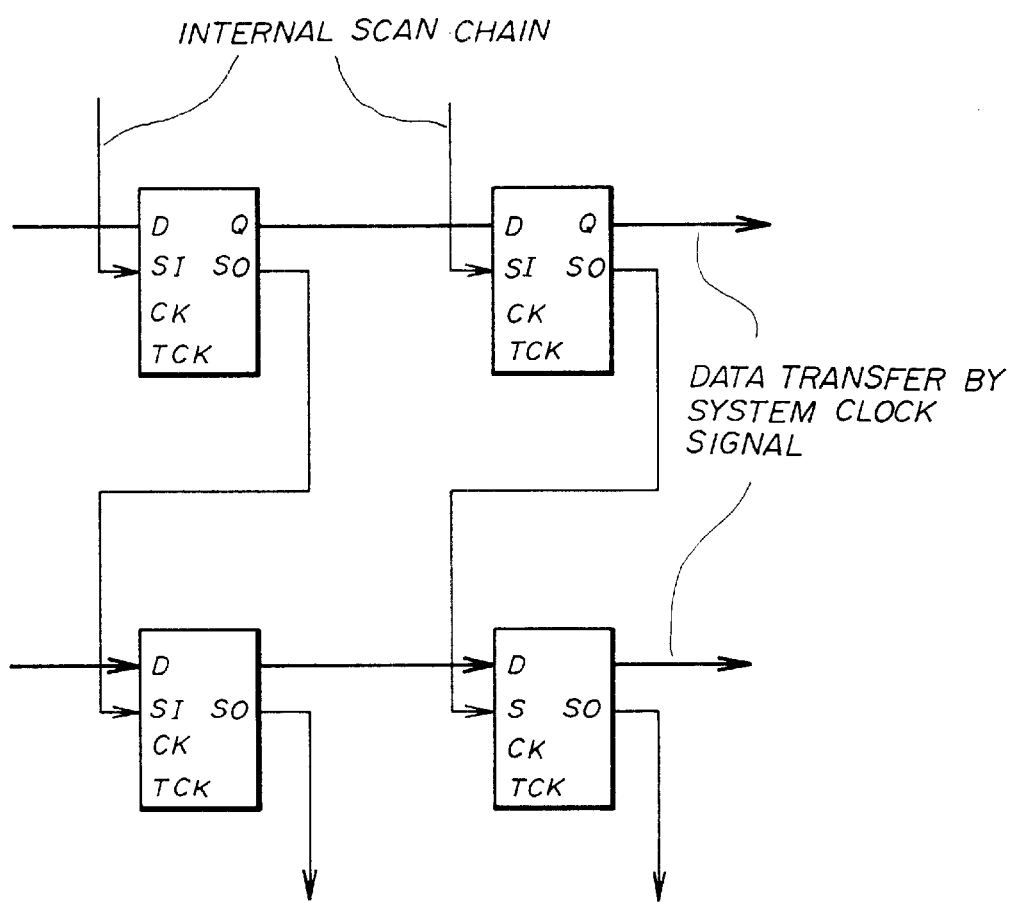
FIG. 5 is a circuit diagram for explaining an internal scan chain.

For example, when making a system failure diagnosis by checking the normal operation of an internal logic circuit 100 provided in the LSI chip 1, the internal scan chain shown in FIG. 5 is used. In this case, the data are successively written into the flip-flops which form the internal boundary chain via scan-in pads 3 ($SI_{11}$, $SI_{12}$) of the input/output cells 2 for scan-in which are arranged in the outermost peripheral part of the LSI chip 1 by the switching of the mode signal. At the same time, the data are also written into the flip-flops existing within the input/output cells 2 of the LSI chip 1 via the boundary scan chain. The system clock signal is supplied again at the time when the write operations with respect to the internal scan chain and the boundary scan chain are completed. As a result, data transfers occur between the flip-flops existing within the internal scan chain and between the flip-flops existing within the boundary scan chain. Thereafter, the data of the flip-flops existing within the internal scan chain are read out via the scan-out pads 3 ($SO_{11}$, $SO_{12}$), and the data of the flip-flops existing within the boundary scan chain are read out via a scan-out pad 3 ($SO_B$). In other words, the test is carried out by outputting the normal operation signal from the scan-out pads 3 ($SO_{11}$, $SO_{12}$) at specific timings while normally operating each LSI chip 1.

Figure 6:
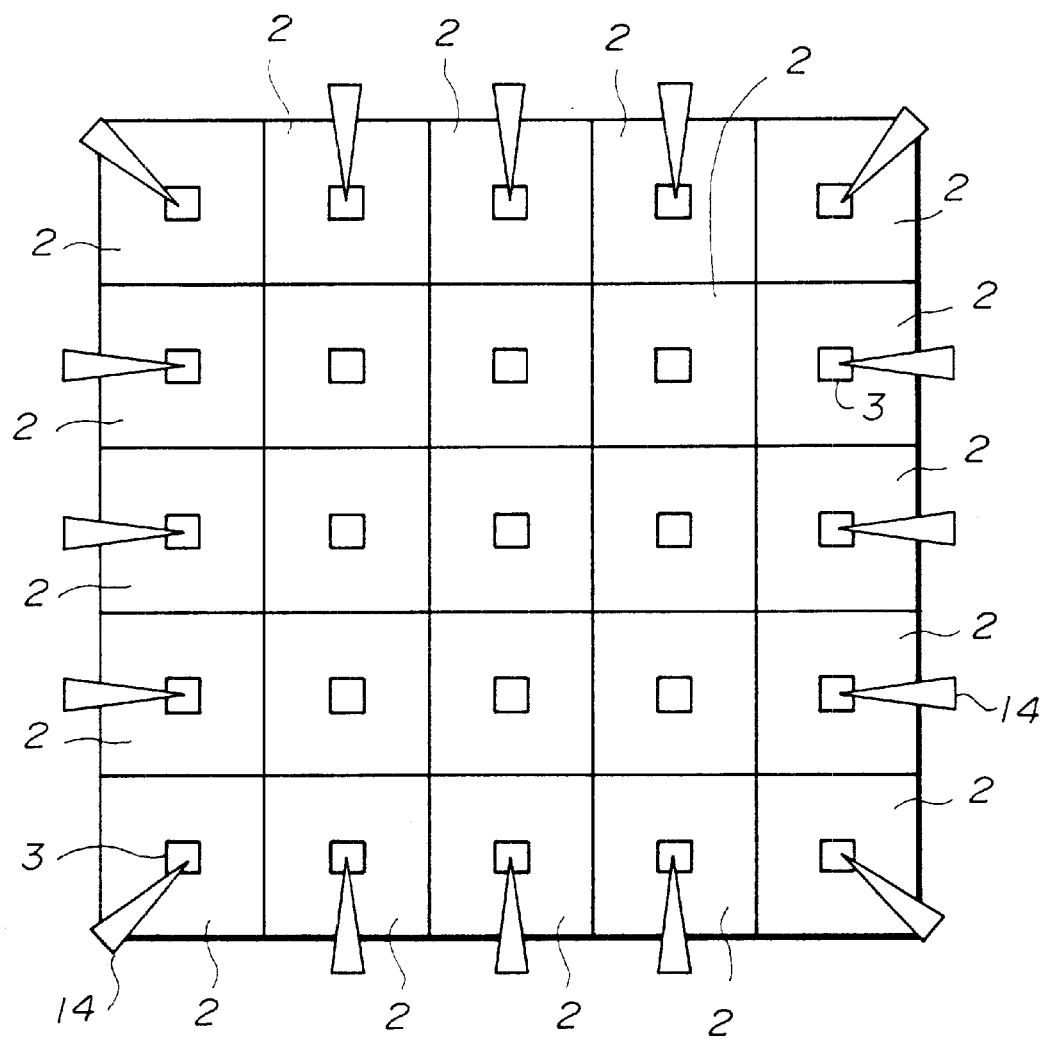
FIG. 6 is a diagram showing the first embodiment in a plan view for explaining the testing thereof.

Accordingly, as shown in FIG. 6, the test can be carried out by contacting the prober needles 14 to the pads 3 of the input/output cells 2 for scan-in/out which are arranged in the outermost peripheral part of the LSI chip 1, for either case where the boundary scan or the internal scan is made. For this reason, the structure of the prober can be made simple as in the case of the conventional case. In addition, because there is no need to increase the number of prober needles 14, it is possible to reduce the cost of the prober and the related testing equipment.

In this embodiment, specific input/output cells 2 are made to function as the input/output cells for scan-in/out, however, arbitrary input/output cells 2 may be made to function as the input/output cells for scan-in/out. Furthermore, although this embodiment uses independent input/output cells 2 for the input/output cell for use in the boundary scan and the input/output cell for use in the internal scan, it is possible to use the same input/output cell for either the boundary scan or the internal scan by switching the scan chain in response to the switching of the mode signal.

Figure 7:
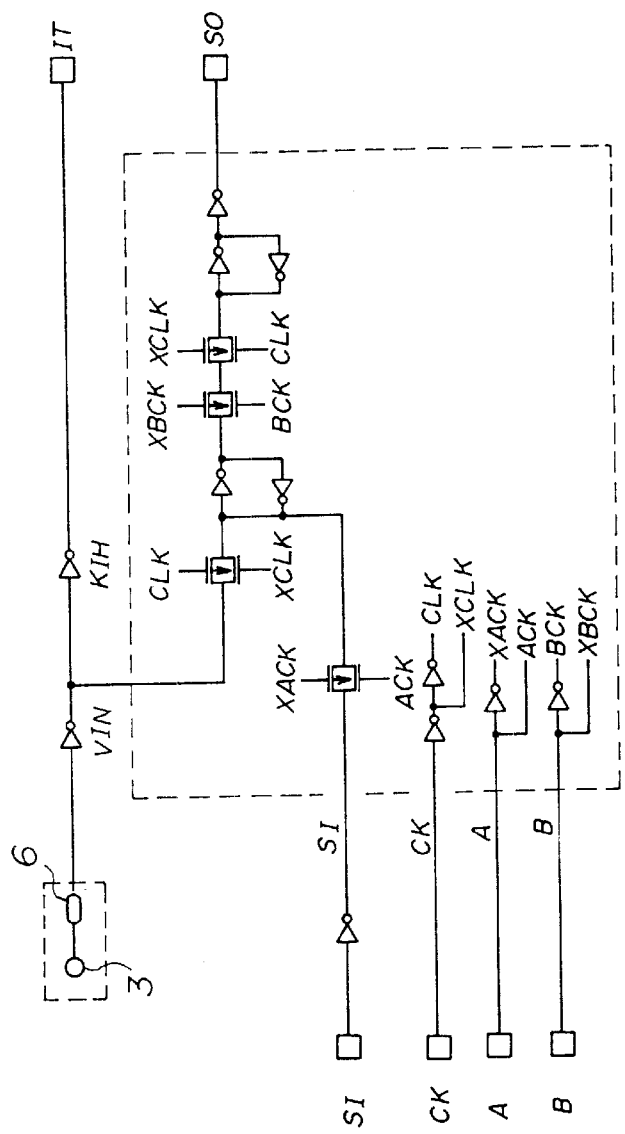
FIGS. 7 through 10 respectively are circuit diagrams showing embodiments of input/output cells shown in FIG. 3.

FIG. 7 shows an embodiment of the input/output cell which may be used as any one of the input/output cells $2_{100}$ and $2_{401}$ through $2_{404}$ shown in FIG. 3. The input/output cell shown in FIG. 7 is made up of inverters and transmission gates which are connected as shown, and the scan data is input thereto.

Figure 8:
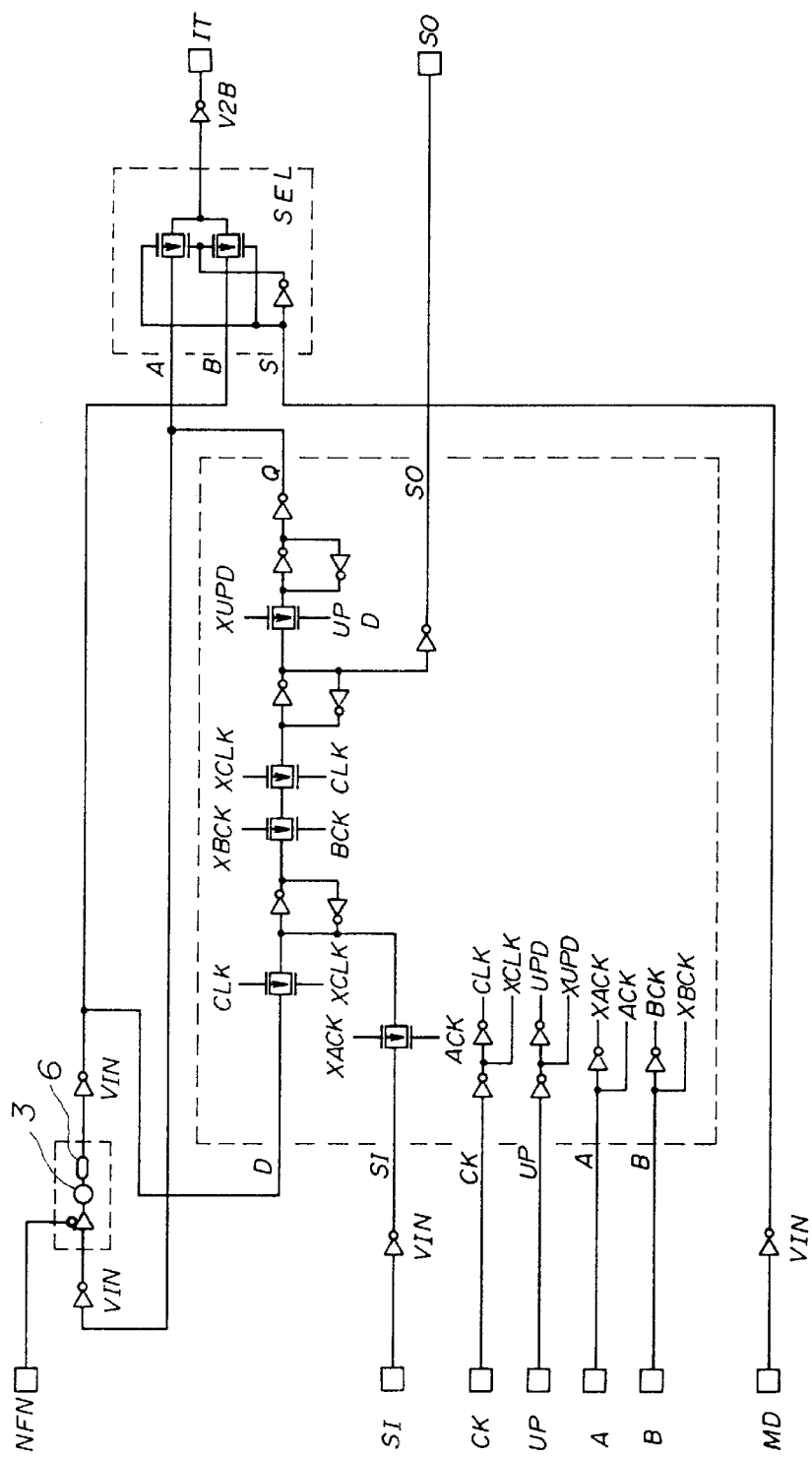

FIG. 8 shows an embodiment of the input/output cell which may be used as the input/output cell $2_{300}$ shown in FIG. 3. The input/output cell shown in FIG. 8 is made up of inverters and transmission gates which are connected as shown, and corresponds to a part of the scan circuit other than the input/output part thereof.

Figure 9:
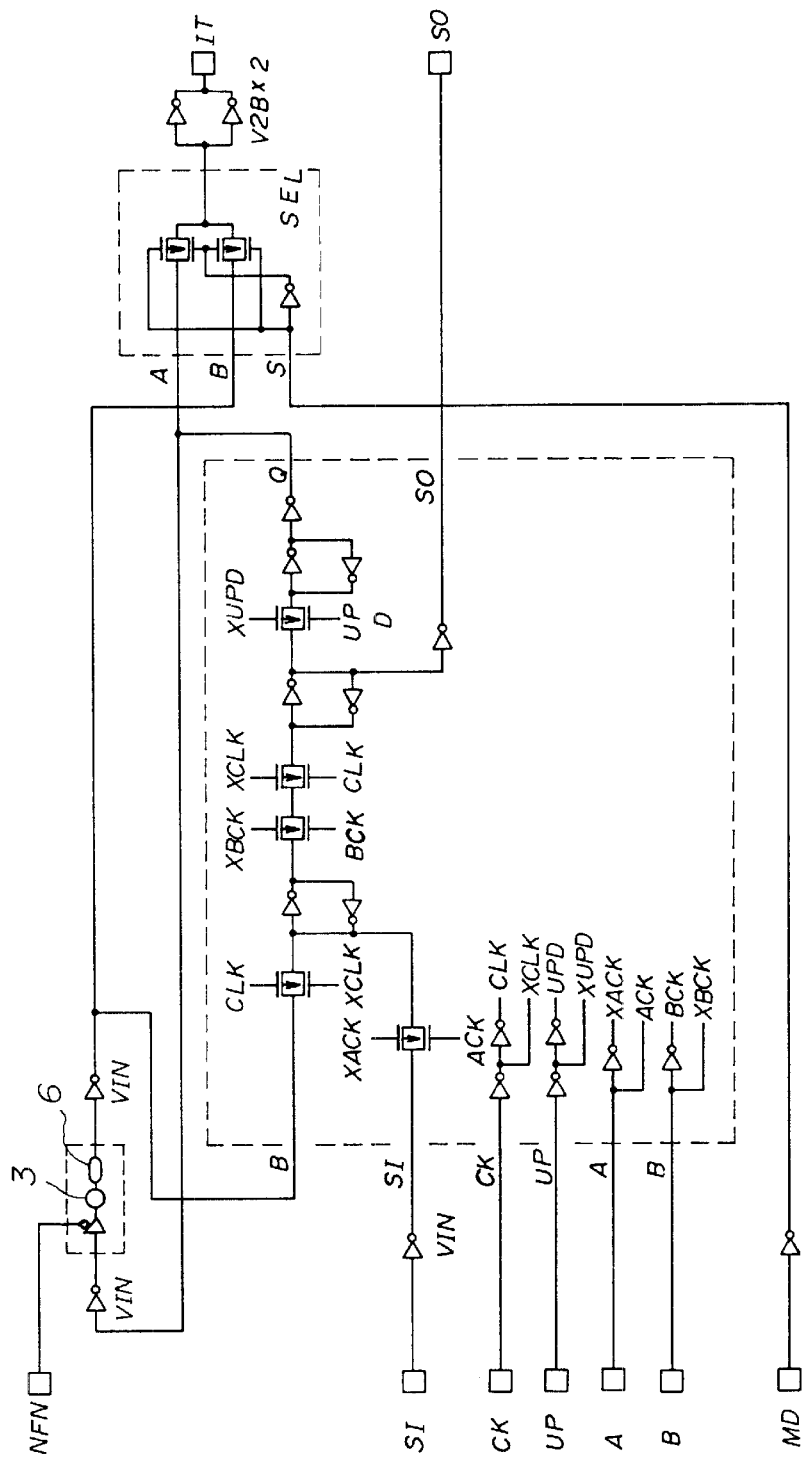

FIG. 9 shows another embodiment of the input/output cell which may be used as the input/output cell $2_{300}$ shown in FIG. 3. The input/output cell shown in FIG. 9 is made up of inverters and transmission gates which are connected as shown, and corresponds to a part of the scan circuit other than the input/output part thereof. The input/output cell shown in FIG. 9 has an increased output driving capability compared to that of the input/output cell shown in FIG. 8.

Figure 10:
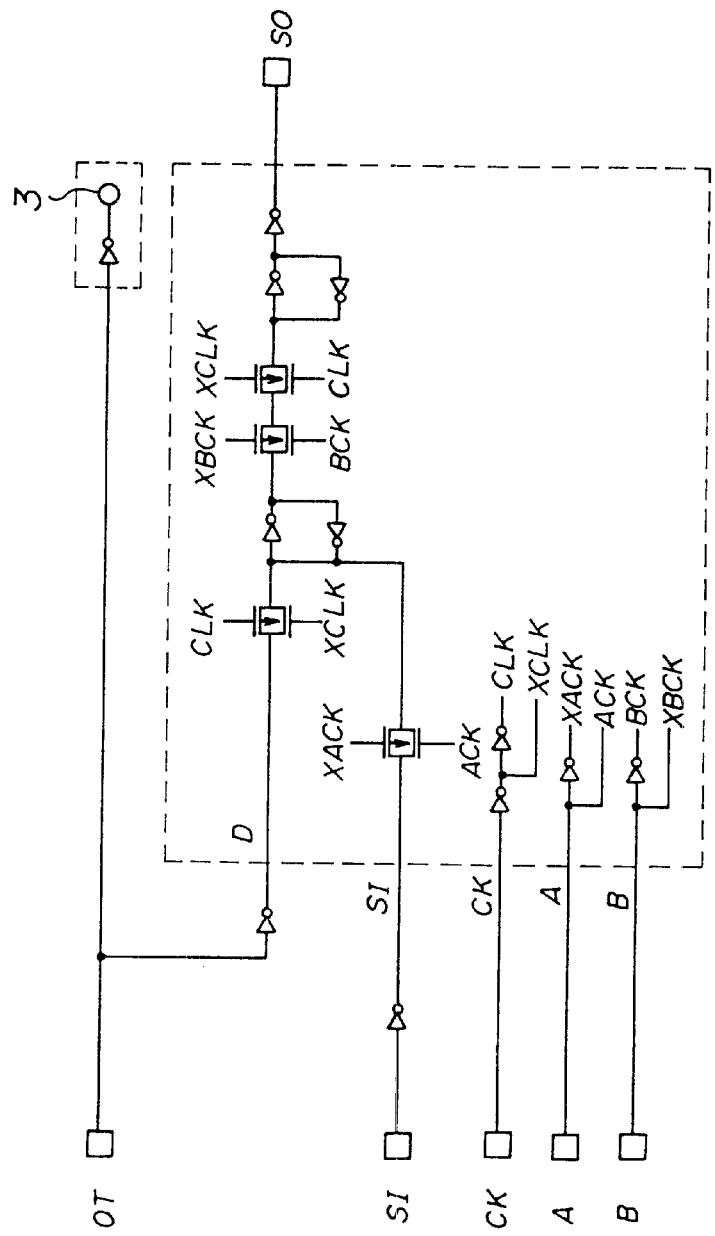

FIG. 10 shows an embodiment of the input/output cell which may be used as the input/output cell $2_{200}$ shown in FIG. 3. The input/output cell shown in FIG. 10 is made up of inverters and transmission gates which are connected as shown, and outputs the scan signal therefrom.

In FIGS. 7 through 9, a protection element (or circuit) 6 is connected to the pad 3.

Figure 11:
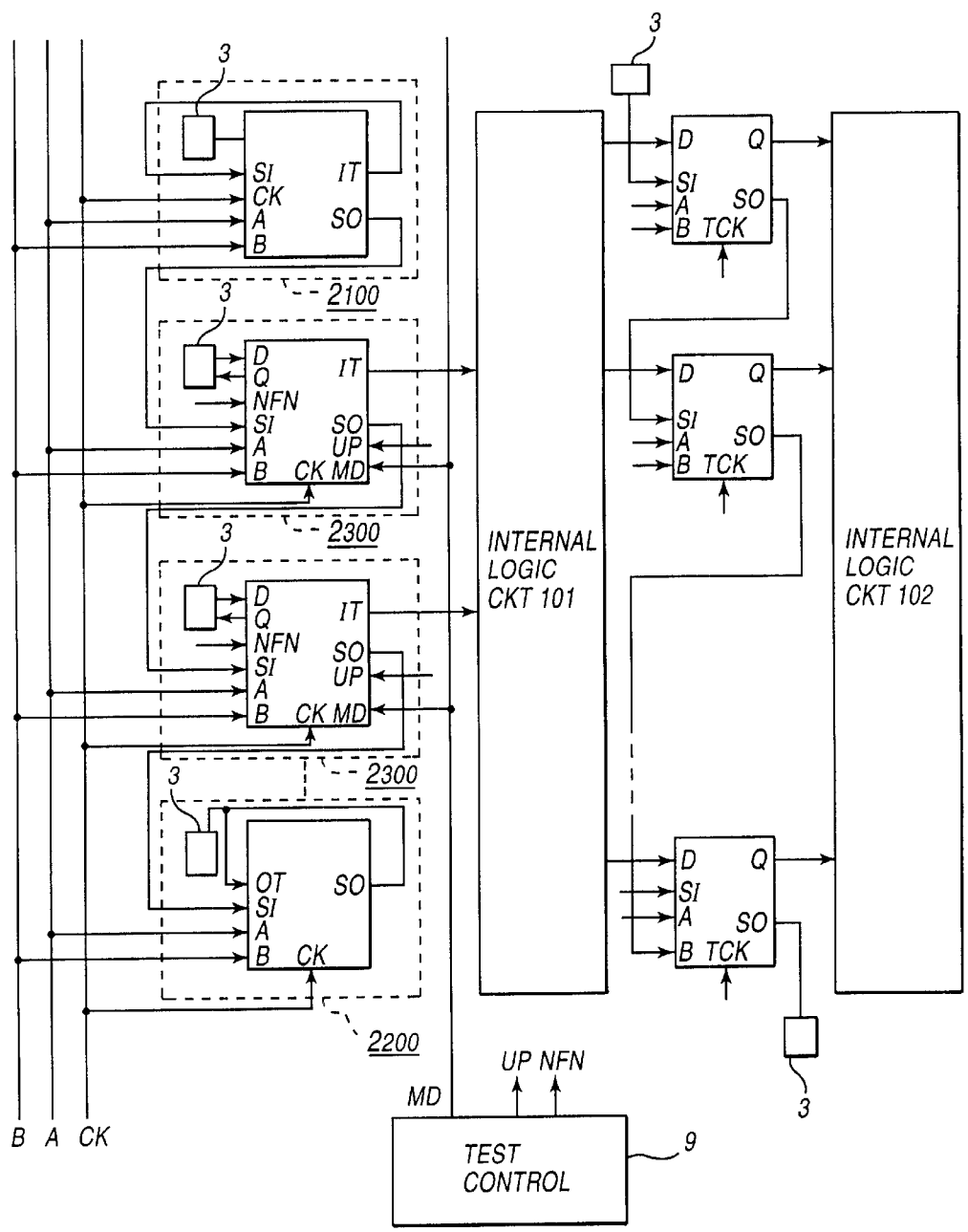
FIG. 11 is a system block diagram showing an embodiment of a scan circuit which is formed by connecting the input/output cells having the constructions shown in FIGS. 7, 8 and 10.
Figure 13:
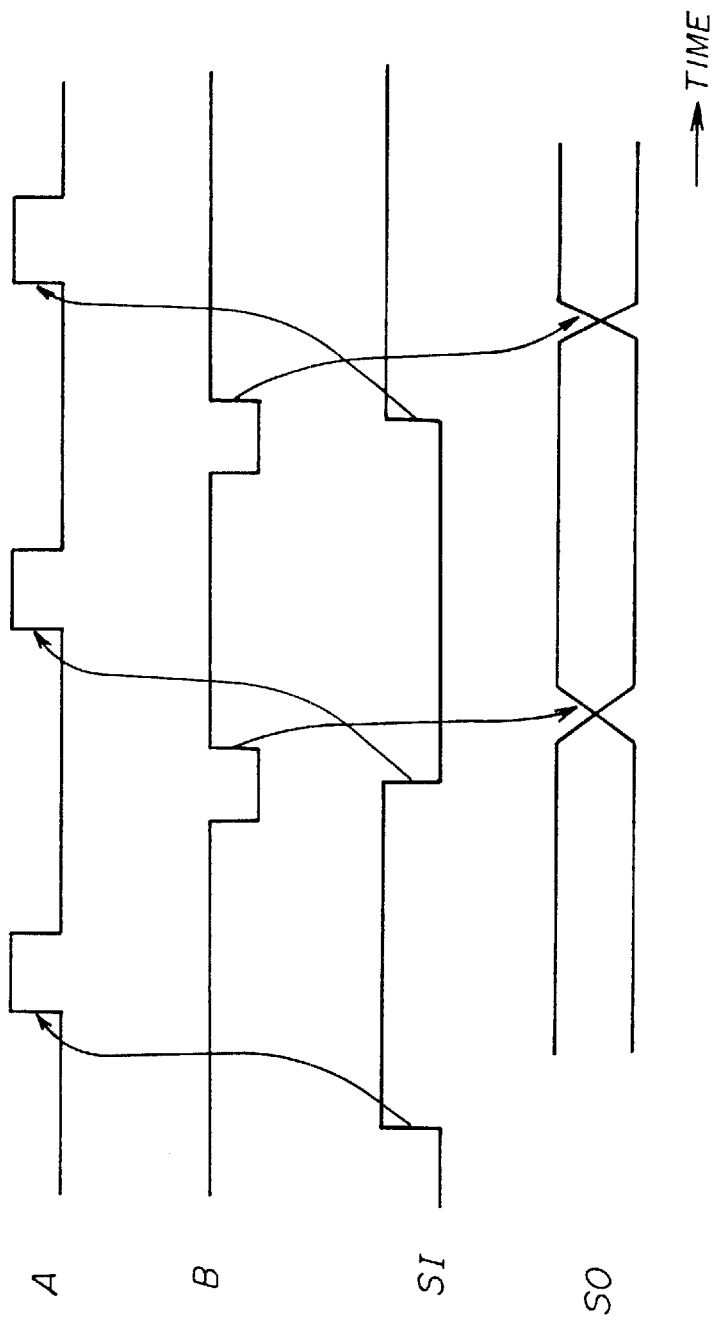
FIG. 13 is a timing diagram for explaining the operation of the scan circuit shown in FIG. 11.

FIG. 11 shows an embodiment of the scan circuit which is formed by the input/output cells having the constructions shown in FIGS. 7, 8 and 10. Each of the input/output cells $2_{100}$, $2_{200}$ and $2_{300}$ output the data input to the scan-in terminal SI thereof from the scan-out terminal SO thereof with the timing shown in FIG. 13 relative to scan clock signals A and B of the scan flip-flop used for making the scan operation.

Figure 12:
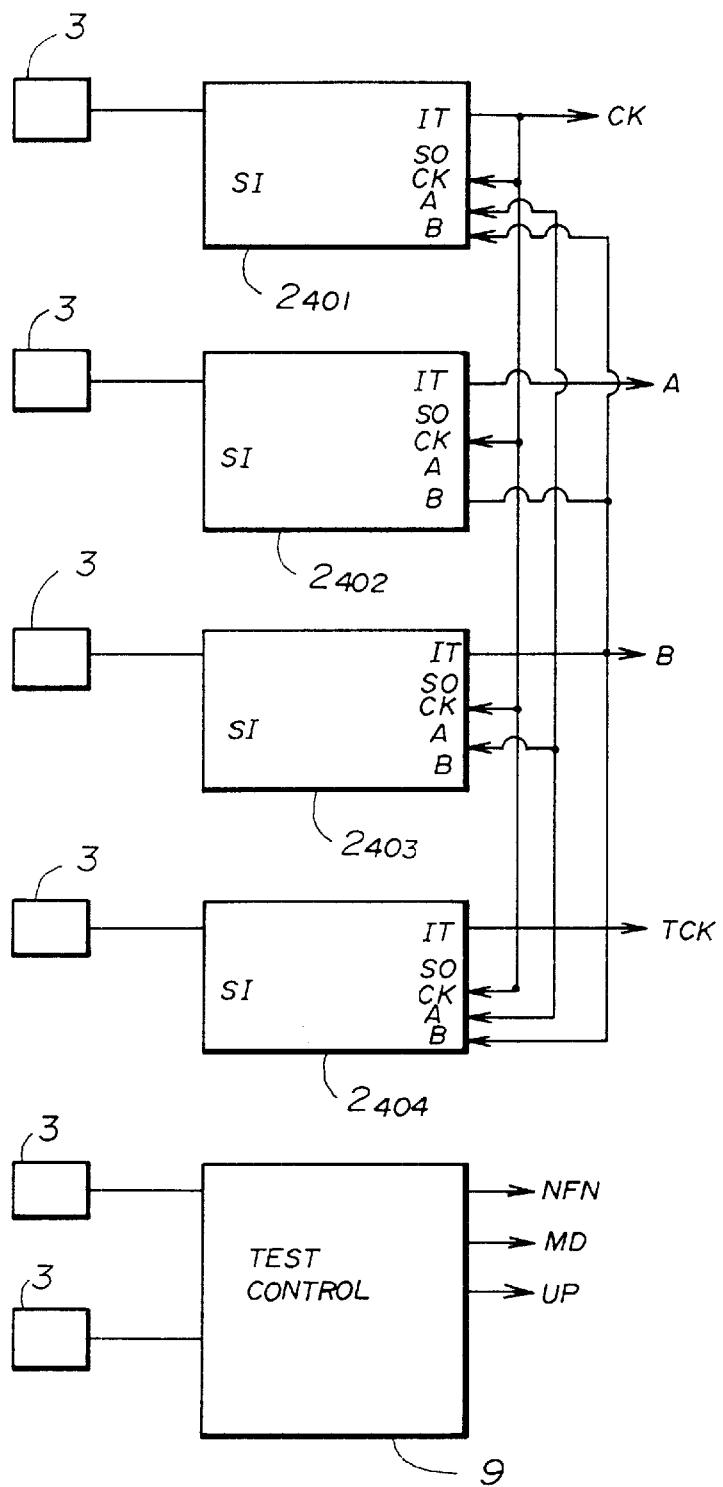
FIG. 12 is a system block diagram showing an embodiment of a circuit which generates various signals supplied to the scan circuit shown in FIG. 11.

In FIG. 11 and FIG. 12 which will be described later, NFN denotes a control signal for controlling the tri-state, IT denotes an input terminal, OT denotes an output terminal, CK denotes a clock signal of the scan flip-flop used for making the normal data read operation, TCK denotes a clock signal applied to the flip-flops forming the internal scan chain, UP denotes a clock signal for reading the content of the scan flip-flop into the latch circuit, and MD denotes a control signal for controlling the selector such as that shown in FIG. 4. The control signals NFN and MD and the clock signal UP are generated from a test control circuit 9 which is provided in the LSI chip, while the clock signals A, B, CK and TCK are generated from a circuit shown in FIG. 12.

In the case shown in FIG. 11, the boundary scan chain formed by the input/output cells $2_{100}$, $2_{200}$ and $2_{300}$ is coupled to the flip-flops forming the internal scan chain via a first internal logic circuit 101, and the flip-flops forming the internal scan chain is coupled to a second internal logic circuit 102. A part of the input/output cell $2_{200}$ surrounded by a dotted line in FIG. 10 may be used as each flip-flop forming the internal scan chain.

FIG. 12 shows an embodiment of the circuit which generates the various control signals and clock signals used in FIG. 11. The circuit shown in FIG. 12 includes the input/output cells $2_{401}$ through $2_{404}$ and the test control circuit 9. The input/output cells $2_{401}$ through $2_{404}$ respectively generate the clock signals CK, A, B and TCK. The clock signal CK is used to input the data held in the scan flip-flop to the scan flip-flop again via the pad 3, and to output the data to the first internal logic circuit 101. The scan clock signals A and B are used to shift the scan data pattern in the row of scan flip-flops within the input/output cells. The clock signal TCK is used to determine the timing with which the data from the first internal logic circuit 101 is entered into the internal scan chain (internal scan circuit) which is indicated by the dotted line in FIG. 3.

The scan test can be carried out as follows. First, the clock signal UP is fixed to the low level and the clock signal CK is fixed to the high level, and the data pattern is entered into the scan flip-flops of the boundary scan chain and the internal scan chain in response to the clock signals A and B shown in FIG. 13.

Second, the clock signal UP is set to the high level and the clock signal CK is set to the low level, and the data is transferred from each scan flip-flop of the boundary scan chain to the first internal logic circuit via the pad 3. At the same time, the clock signal TCK is input to each scan flip-flop of the internal scan chain so as to output the data from each scan flip-flop of the internal scan chain to the second internal logic circuit and to input the data from the first internal logic circuit to the terminal D of each scan flip-flop of the internal scan chain.

Third, the data is output via each scan-out flip-flop in response to the clock signals A and B.

Figure 14:
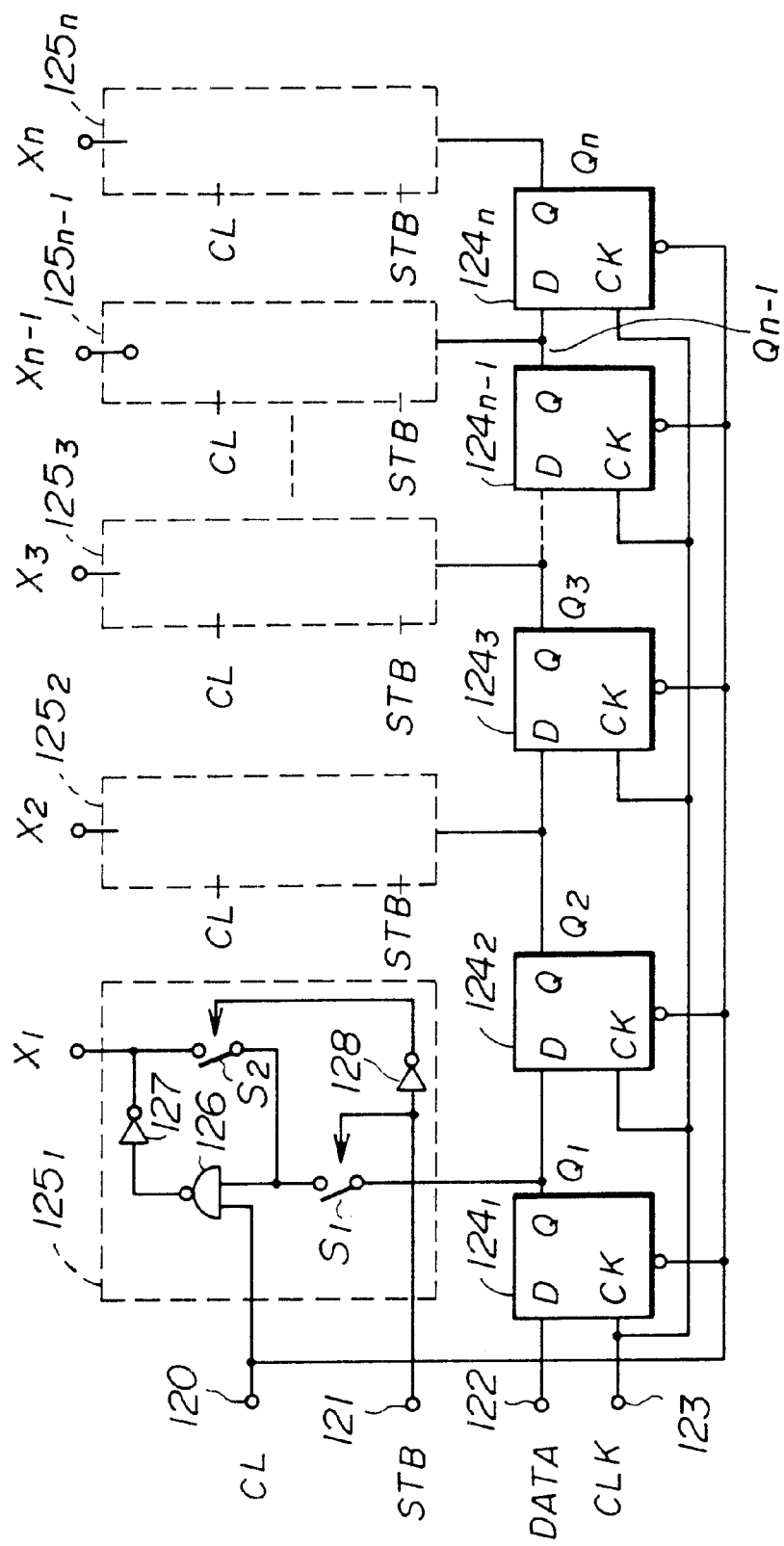
FIG. 14 is a circuit diagram showing an essential part of a second embodiment of the semiconductor integrated circuit according to the present invention.

FIG. 14 shows a part of a second embodiment of the semiconductor integrated circuit according to the present invention. The circuit shown in FIG. 14 corresponds to a test input circuit of the integrated circuit. In FIG. 14, external terminals 120 through 123 are the pads (or bumps) which are arranged in the peripheral part on the surface of the LSI (or semiconductor) chip such as that shown in FIG. 3. A clear signal CL, a strobe signal STB, a data signal DATA for testing and a clock signal CLK are respectively input to the terminals 120, 121, 122 and 123.

D-type flip-flops $124_1$ through $124_n$ are connected in series and forms a first shift register. The flip-flops $124_1$ through $124_n$ are cleared during a low-level period of the clear signal CL which is shown in FIG. 15(A) and is input from the terminal 120, and Q-terminals of the flip-flops $124_1$ through $124_n$ are set to the low level.

Figure 15:
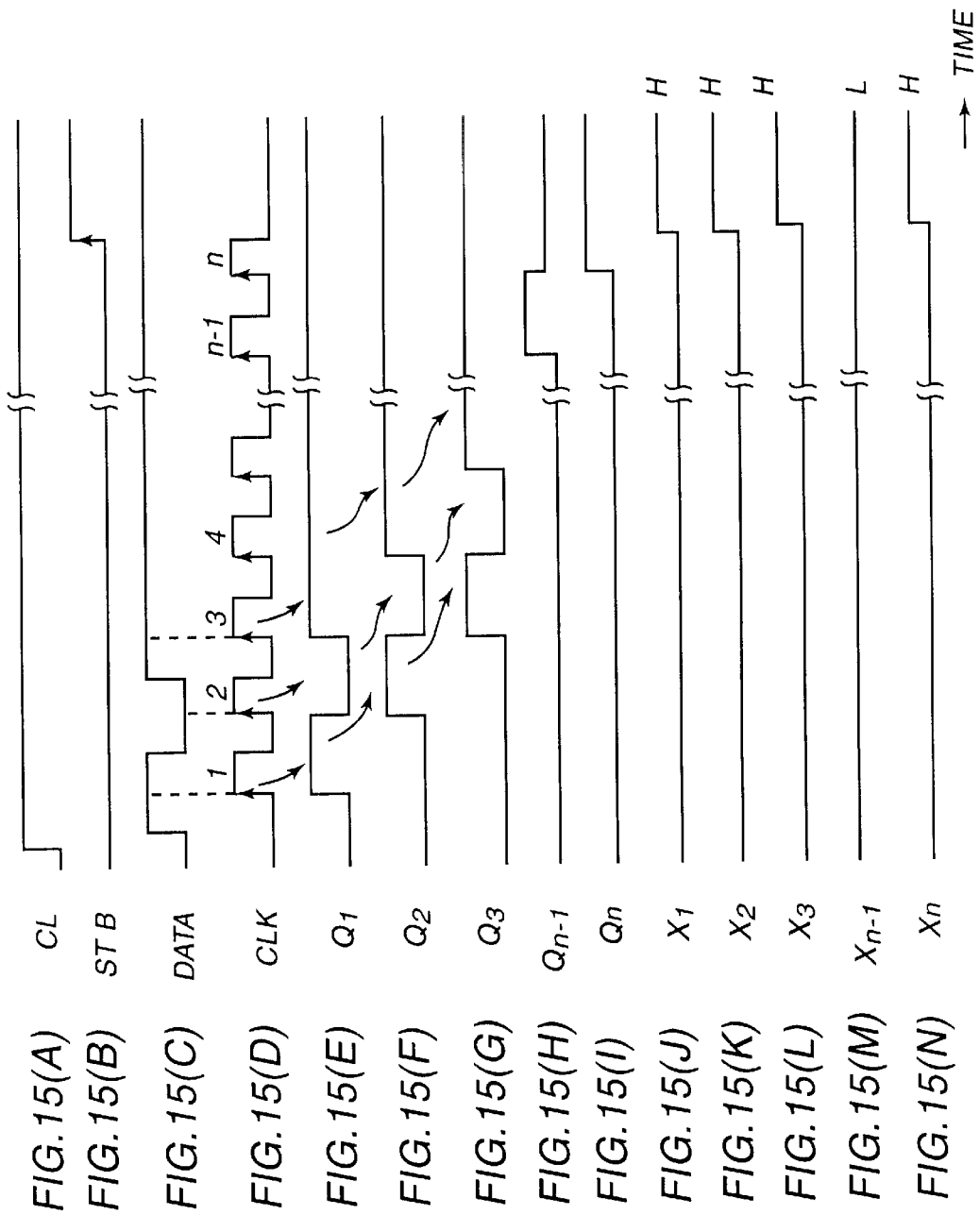
FIGS. 15(A)–15(N) are timing diagrams for explaining the operation of the circuit shown in FIG. 14.

Thereafter, the data signal DATA shown in FIG. 15(C) which is input from the terminal 122 is successively shifted in the flip-flops $124_1$ through $124_n$ in response to the clock signal CLK which is shown in FIG. 15(D) and is input to the terminal 123. Hence, outputs from the Q-terminals of the flip-flops $124_1$ through $124_n$ are respectively set as shown in FIGS. 15(E) through 15(I).

The outputs from the Q-terminals of the flip-flops $124_1$ through $124_n$ are respectively supplied to latch circuits $125_1$ through $125_n$. The latch circuits $125_1$ through $125_n$ have the same construction, and only the construction of the latch circuit $125_1$ is shown in FIG. 14. Each latch circuit receives the clear signal CL from the terminal 120 and the strobe signal STB which is shown in FIG. 15(B) and is obtained from the terminal 121. The latch circuits $125_1$ through $125_n$ respectively make output signals $X_1$ through $X_n$ thereof shown in FIGS. 15(J) through 15(N) to the low level during the low-level period of the clear signal CL via respective NAND circuit 126 and inverter 127. In FIGS. 15(J) through 15(N) and timing charts which follow, "H" denotes the high-level and "L" denotes the low level of the signal. When the level of the strobe signal STB becomes high, a switch $S_1$ closes, a switch $S_2$ opens in response to the strobe signal STB which is inverted by an inverter 128, and the output of the inverter 127 is fed back to the NAND circuit 126 so as to latch the corresponding one of the output signals $X_1$ through $X_n$. The output signals $X_1$ through $X_n$ which are latched in the latch circuits $125_1$ through $125_n$ are supplied to the pads located at the central part on the surface of the LSI chip.

Figure 16:
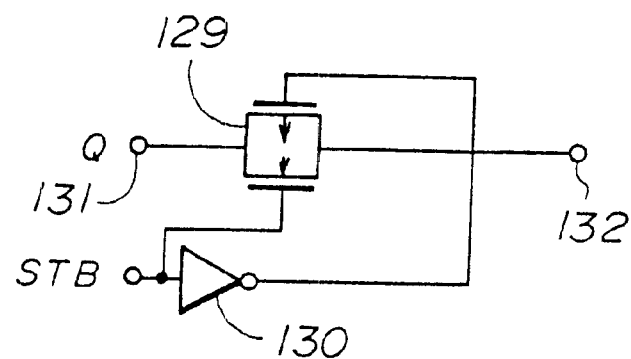
FIG. 16 is a circuit diagram showing an embodiment of a switch shown in FIG. 14.

The switch $S_1$ is made up of a transmission gate 129 and an inverter 130 which inverts the strobe signal STB, as shown in FIG. 16. The output from the Q-terminal 131 of the corresponding one of the flip-flops $124_1$ through $124_n$ is supplied from a terminal 132 to the NAND circuit 126 during the high-level period of the strobe signal STB. The switch $S_2$ is constructed similarly to the switch $S_1$.

Figure 17:
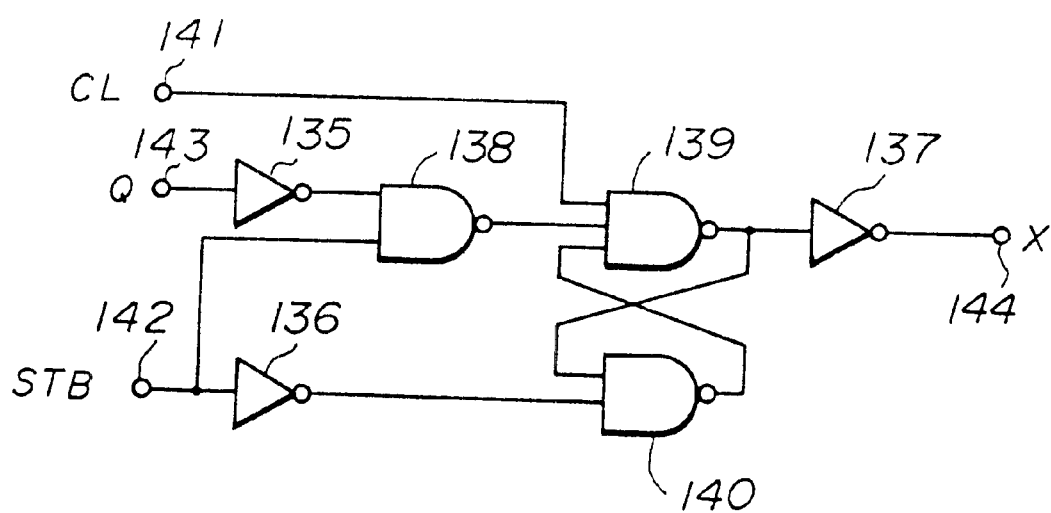
FIG. 17 is a circuit diagram showing an embodiment of a latch circuit shown in FIG. 14.

As shown in FIG. 17, it is possible to use a latch circuit which is made up of inverters 135 through 137 and NAND circuits 138 through 140 in place of each of the latch circuits $125_1$ through $125_n$ shown in FIG. 14. In this case, the clear signal CL is input to a terminal 141, the strobe signal STB is input to a terminal 142, and the output from the Q-terminal of the corresponding one of the flip-flops $124_1$ through $124_n$ is input to a terminal 143. The output signal X is output from a terminal 144.

Figure 18:
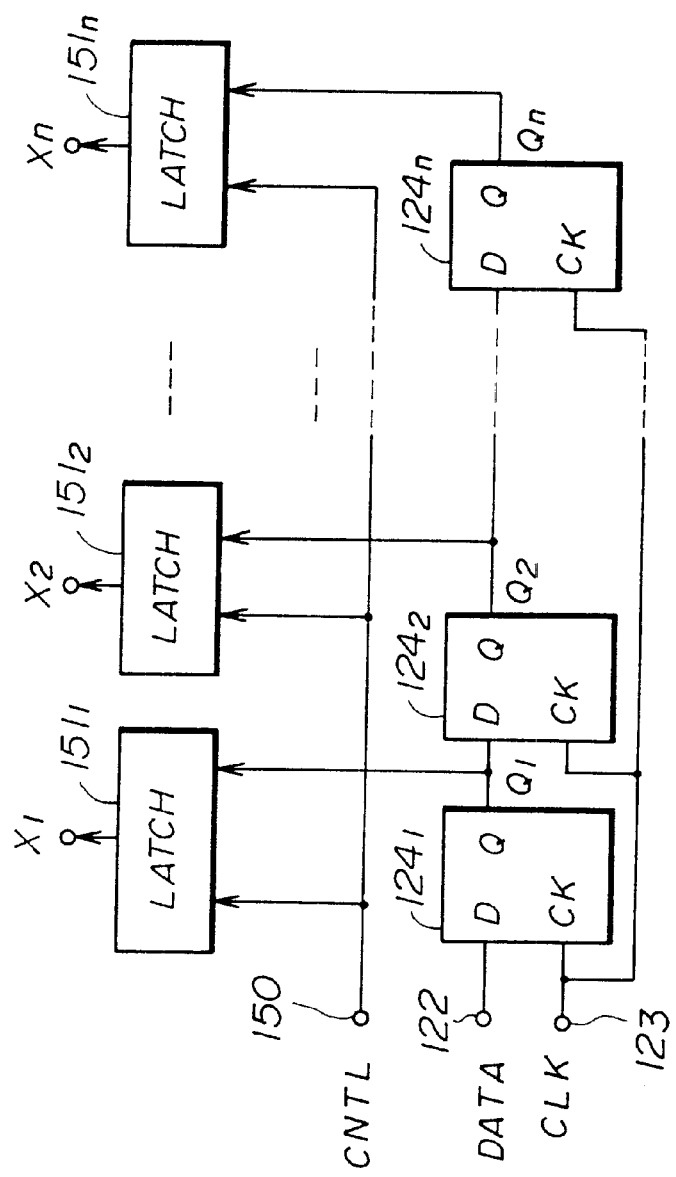
FIG. 18 is a circuit diagram showing a modification of the essential part of the second embodiment of the semiconductor integrated circuit according to the present invention.

FIG. 18 shows a modification of the semiconductor integrated circuit shown in FIG. 14. In FIG. 18, those parts which are the same as those corresponding parts in FIG. 14 are designated by the same reference numerals, and a description thereof will be omitted.

In FIG. 18, an external terminal 150 corresponds to the pad which is arranged in the peripheral part on the surface of the LSI chip. A control signal CNTL shown in FIG. 19(A) is input to this external terminal 150 and is supplied to each of latch circuits $151_1$ through $151_n$. The flip-flops $124_1$ through $124_n$ which form the shift register shift the data signal DATA shown in FIG. 19(B) in response to the clock signal CLK shown in FIG. 19(C), and the outputs from the Q-terminals of the flip-flops $124_1$ through $124_n$ shown in FIGS. 19(D) through 19(F) are respectively supplied to the latch circuits $151_1$ through $151_n$. The outputs $X_1, X_2, \ldots X_n$ of latch circuits $151_1, 151_2 \ldots 151_n$ are shown in FIGS. 19(G)–19(I).

As shown in FIG. 20, each of the latch circuits $151_1$ through $151_n$ include inverters 156 and 157 for inverting the control signal CNTL from a terminal 155 to generate a control signal for transmission gates, a transmission gate 159 for supplying the output from the Q-terminal of the corresponding one of the flip-flops $124_1$ through $124_n$ received via a terminal 158 to inverters 160 and 161, and a transmission gate 162 for feeding back the output of the inverter 161 to the inverter 160 to form a latch loop. During the high-level period of the control signal CNTL, the transmission gate 159 closes and the signal Q from the terminal 158 is output from a terminal 163 as the output signal X. In addition, during the low-level period of the control signal CNTL, the transmission gate 162 closes and the output signal X is latched.

In other words, the latch circuits $151_1$ through $151_n$ shown in FIG. 18 respectively obtain the outputs from the Q-terminals of the flip-flops $124_1$ through $124_n$ during the high-level period of the control signal CNTL and output these outputs from the Q-terminals as the output signals $X_1$ through $X_n$ to the pads at the central part on the surface of the LSI chip.

Figure 21:
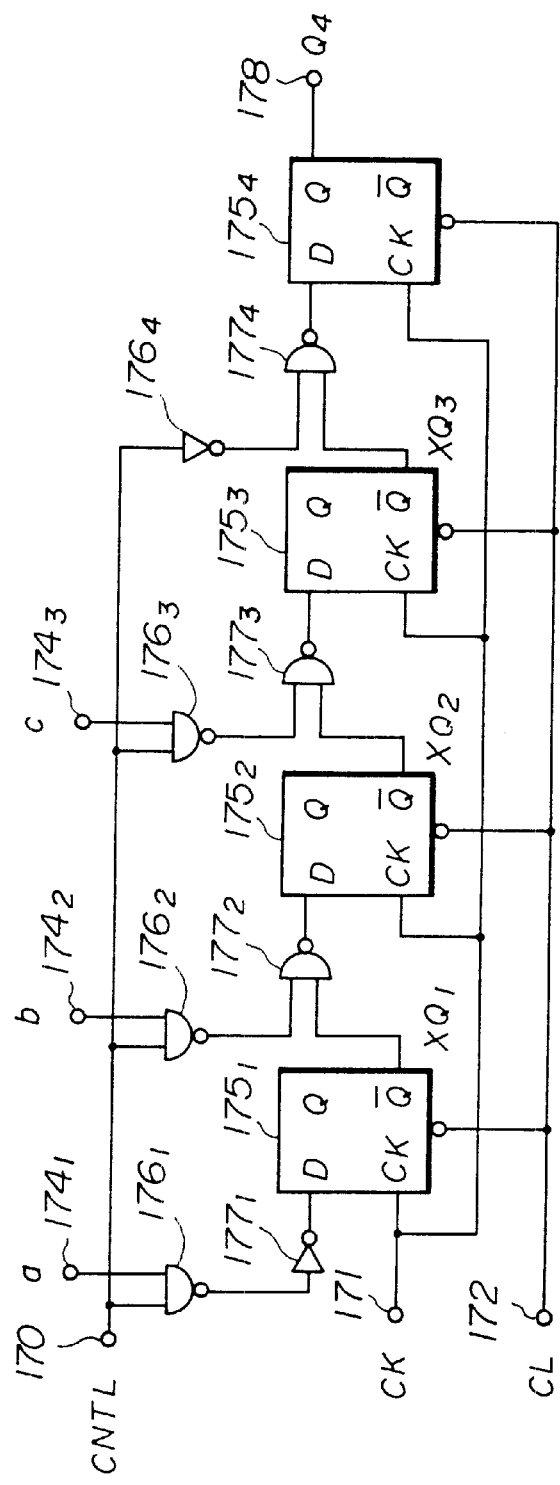
FIG. 21 is a circuit diagram showing another essential part of the second embodiment of the semiconductor integrated circuit according to the present invention.

FIG. 21 shows another part of the second embodiment of the semiconductor integrated circuit according to the present invention. The circuit shown in FIG. 21 corresponds to a test output circuit of the integrated circuit. In FIG. 21, external terminals 170 through 172 are the pads arranged at the peripheral part on the surface of the LSI chip. The control signal CNTL, the clock signal CK and the clear signal CL are respectively input to the terminals 170 through 172.

Terminals $174_1$ through $174_3$ are the pads for output arranged at the central part on the surface of the LSI chip, and are respectively supplied with signal a, b and c which are output from an internal circuit.

Figure 22:
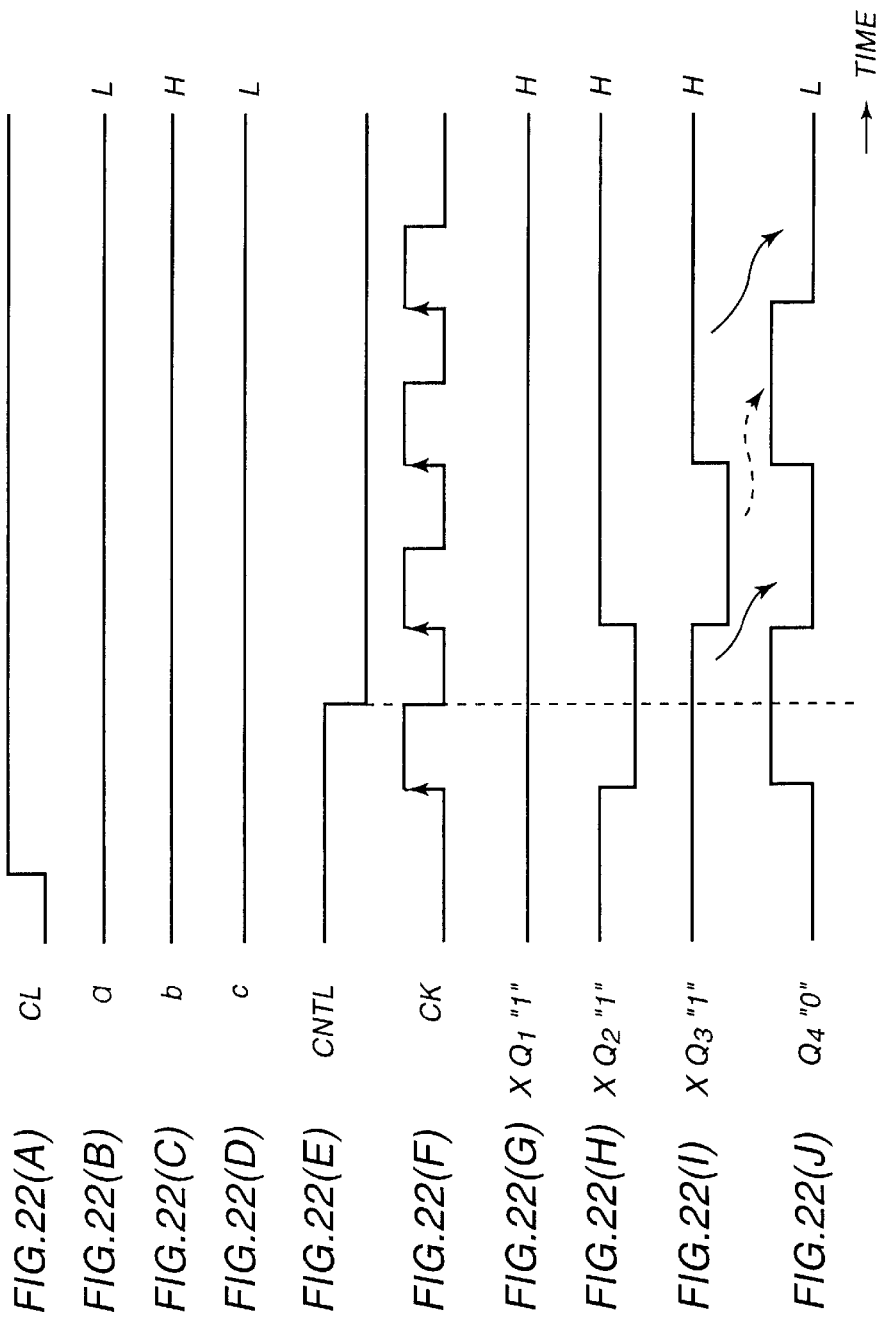
FIGS. 22(A)–22(J) are timing diagrams for explaining the operation of the circuit shown in FIG. 21.

D-type flip-flops $175_1$ through $175_4$ are connected in series to form a second shift register, and are cleared during the low-level period of the clear signal CL shown in FIG. 22(A). NAND circuits $176_1$ through $176_3$ respectively invert the signals a, b and c shown in FIGS. 22(B), 22(C) and 22(D) during the high-level period of the control signal CNTL shown in FIG. 22(E). The inverted signals from the NAND circuits $176_1$, $176_2$ and $176_3$ are respectively supplied to the flip-flops $175_1$, $175_2$ and $175_3$ via an inverter $177_1$ and NAND circuits $177_2$ and $177_3$, and the inverted signals are respectively set in the flip-flops $175_1$ through $175_3$ at the rising edge of the clock signal CK shown in FIG. 22(F). In addition, a high-level signal is set in the flip-flop $175_4$ via an inverter $176_4$ and a NAND circuit $177_4$ at the first rising edge of the clock signal CK.

Thereafter, outputs from Q-terminals of the flip-flops $175_1$ through $175_3$ shown in FIGS. 22(G) through 22(I) are respectively supplied to the flip-flops $175_2$ through $175_4$ of the next stage via the NAND circuits $177_2$ through $177_4$ every time the clock signal CK is received. As a result, the output from the Q-terminal of the flip-flop $175_4$ shown in FIG. 22(J) is output via a terminal 178. This terminal 178 is the pad for output arranged at the peripheral part on the surface of the LSI chip.

Therefore, the test data which is serially input from the pad located at the peripheral part of the LSI chip is supplied to the pad located at the central part of the LSI chip via the flip-flops $124_1$ through $124_n$ which form the first shift register and the latch circuits $125_1$ through $125_n$. In addition, the output signal from the pad located at the central part of the LSI chip is serially output from the pad located at the peripheral part of the LSI chip via the flip-flops $175_1$ through $175_4$ which form the second shift register. For this reason, it is possible to carry out the required test by making the probe needle contact the pad which is located at the peripheral part of the LSI chip.

Figure 23:
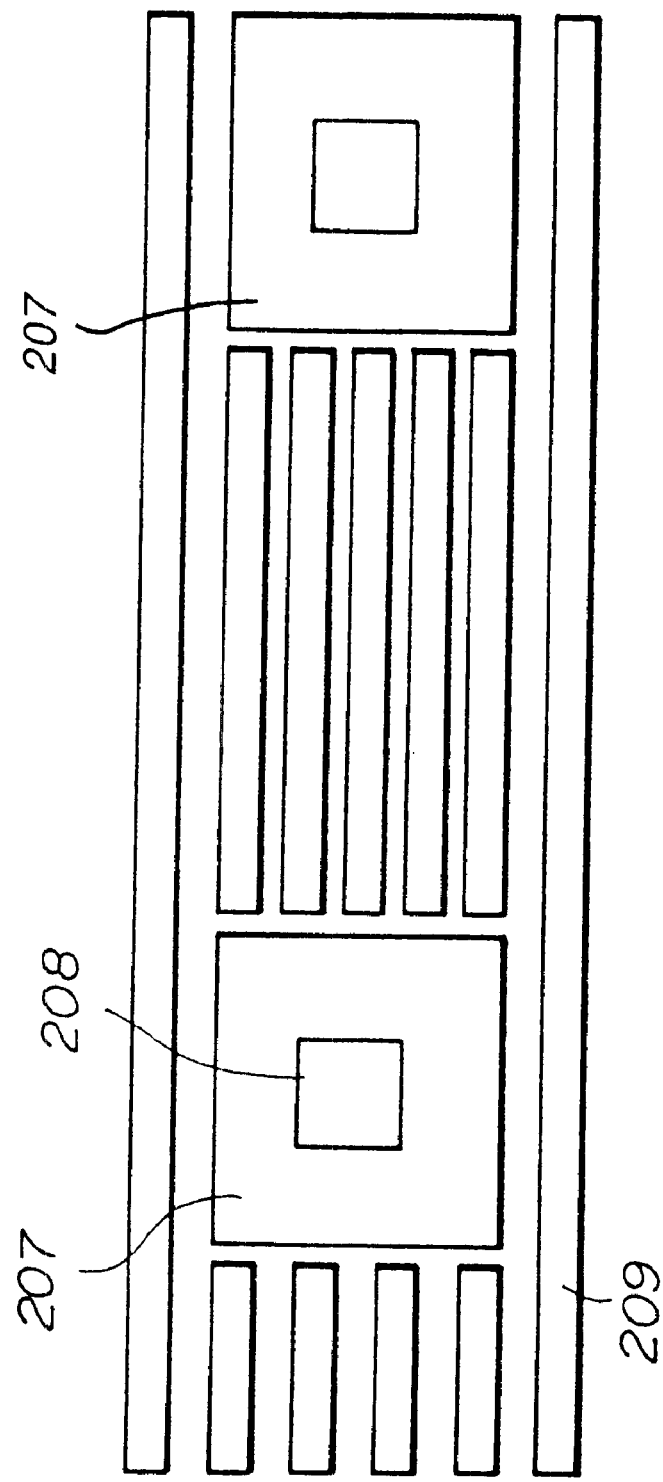
FIG. 23 is a plan view for explaining considerations to be made when arranging the input/output cells on the LSI chip.

For example, in a gate array type semiconductor integrated circuit, there basically are two problems if the input/output cells (or circuits) are arranged at the inner part of the surface of the LSI chip. That is, as shown in FIG. 23, the region of the LSI chip where logic circuits are to be formed becomes used up by an input/output cell 207, and in addition, the input/output cell 207 isolates basic cell rows 209. As a result, the integration density of the internal circuit of the LSI chip becomes poor. In FIG. 23, one of the input/output cells 207 is shown as having a pad 208.

Therefore, when arranging the input/output cells at not only the peripheral part on the surface of the LSI chip but also at the inner part on the surface of the LSI chip, it is necessary to use an arrangement which minimizes the deterioration of the integration density of the internal circuit of the LSI chip.

On the other hand, in order to realize a high-speed operation of the semiconductor integrated circuit, there are demands to improve the data transfer speed between the semiconductor integrated circuits. In order to satisfy such demands, there are proposals to mount a plurality of semiconductor integrated circuits on a single substrate. However, the input/output cells are also required in this case to make the data transfer between the substrates.

Generally, the input/output cell which is used to make the data transfer between semiconductor integrated circuits which are mounted on mutually different substrates must use an output transistor which has a greater size compared to other transistors used within the semiconductor integrated circuits. For this reason, the input/output cell which is used for such a data transfer occupies a greater area than an input/output cell which is used for the data transfer within the same substrate. Accordingly, this difference in the sizes of the input/output cells depending on the usage thereof must be taken into consideration when arranging the input/output cells not only at the peripheral part but also at the inner part on the surface of the LSI chip.

Next, a description will be given of a third embodiment of the semiconductor integrated circuit according to the present invention which takes the above into consideration, by referring to FIGS. 24 through 32. In this embodiment, the input/output cells which occupy a small area compared to other input/output cells are mainly arranged at the inner part on the surface of the LSI chip, so as to minimize the deterioration of the integration density of the internal circuit of the LSI chip caused by the input/output cells which occupy a relatively large area compared to other input/output cells.

In this embodiment, the present invention is applied to the gate array type semiconductor integrated circuit.

Figure 24:
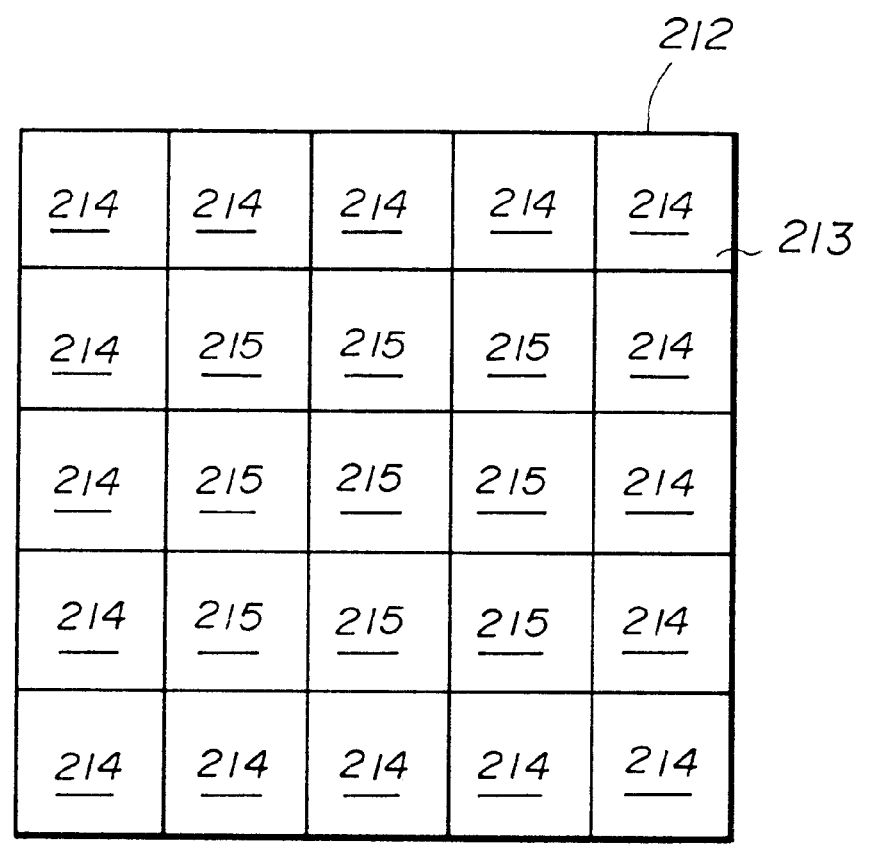

FIG. 24 generally shows the concept of this embodiment. In FIG. 24, the LSI chip includes a chip body 212, an element forming surface 213, and input/output cells (or circuits) 214 and 215. The input/output cell 214 is used for the data transfer between a first substrate on which this embodiment is mounted and a second substrate which is different from the first substrate.

Figure 25:
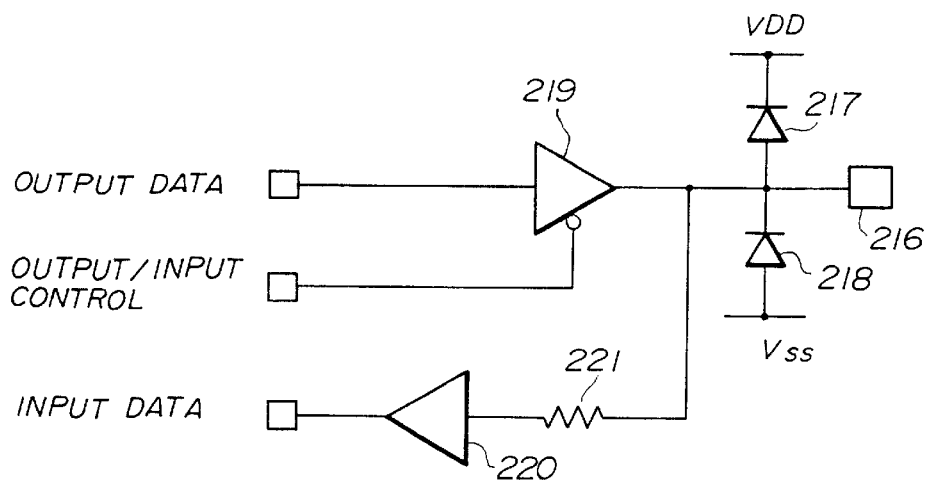
FIG. 25 is a circuit diagram showing an embodiment of one input/output cell shown in FIG. 24.

FIG. 25 shows the circuit construction of the input/output cell 214. The input/output cell 214 includes a pad 216, protection diodes 217 and 218, an output circuit 219, and input circuit 220, and an input protection resistor 221.

On the other hand, the input/output cell 215 is used for the data transfer between LSI chips (semiconductor integrated circuits) which are mounted on the same first substrate.

Figure 26:
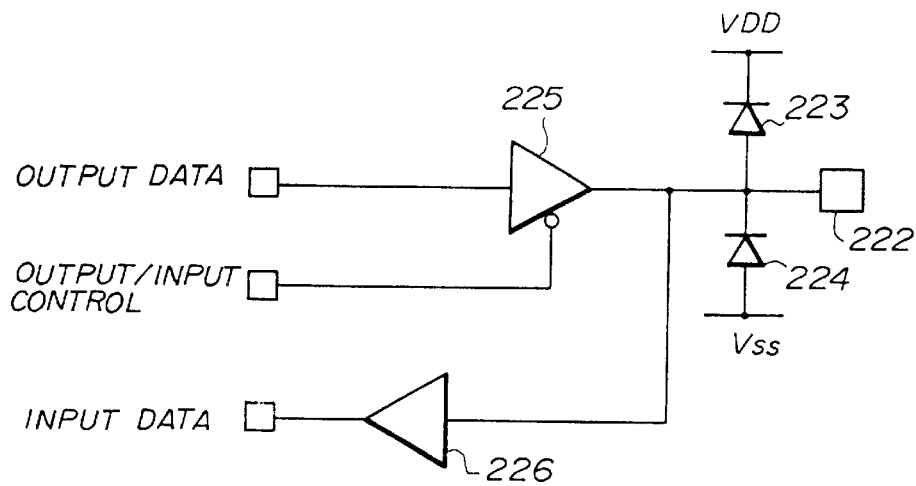
FIG. 26 is a circuit diagram showing an embodiment of another input/output cell shown in FIG. 24.

FIG. 26 shows the circuit construction of the input/output cell 215. The input/output cell 215 includes a pad 222, protection diodes 223 and 224, an output circuit 225, and an input circuit 226.

The area occupied by the protection diodes 217 and 218 of the input/output cell 214 is greater than the area occupied by the protection diodes 223 and 224 of the input/output cell 215, so that more strong measures are taken in the input/output cell 214 against electrostatic destruction.

In addition, the size of the output transistor forming the output circuit 219 of the input/output cell 214 is greater than the size of the output transistor forming the output circuit 225 of the input/output cell 215, so that stronger measures are taken in the input/output cell 214 as regards the current driving capability of the output circuit 219.

Figure 27:
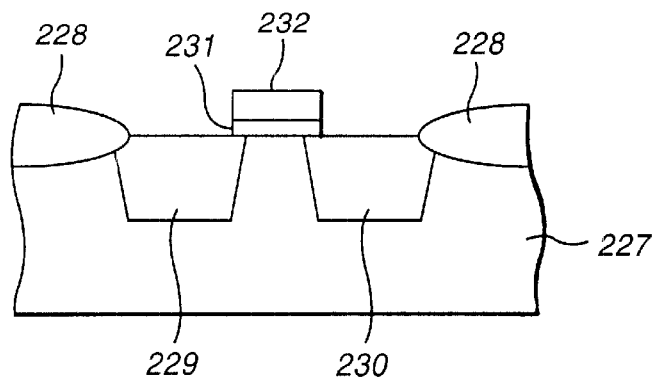
FIG. 27 is a cross sectional view showing an output transistor which forms an output circuit of the input/output cell shown in FIG. 25.

FIG. 27 shows a cross section of the output transistor forming the output circuit 219 of the input/output cell 214. There are shown in FIG. 27 a silicon substrate 227, a field oxide layer 228, a drain diffusion layer 229, a source diffusion layer 230, a gate oxide layer 231 and a gate 232. This output transistor has the drain diffusion layer 229 and the source diffusion layer 230 which are formed to a relatively deep part of the substrate 227 so as to increase the withstand voltage against electrostatic destruction.

Figure 28A:
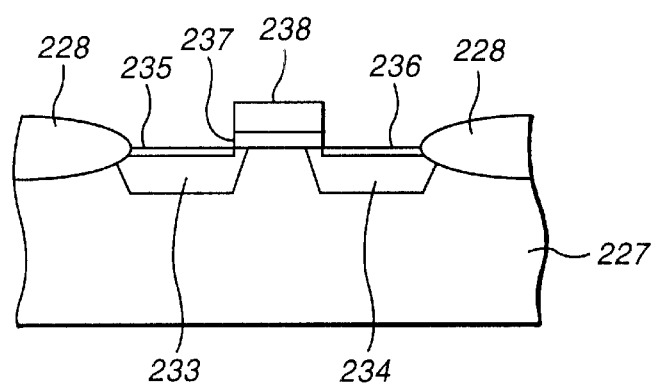
FIGS. 28(a)–28(b) are cross sectional views showing an output transistor which forms an output circuit of the input/output cell shown in FIG. 26 and an input transistor forming the input circuit of the input/output cell shown in FIG. 25, respectively.

FIG. 28(a) shows a cross section of the output transistor forming the output circuit 225 of the input/output cell 215. In FIG. 28(a), those parts which are the same as those corresponding parts in FIG. 27 are designated by the same reference numerals, and a description thereof will be omitted. There are shown in FIG. 28(a) a drain diffusion layer 233, a source diffusion layer 234, silicide layers 235 and 236, a gate oxide layer 237 and a gate 238. This output transistor has the drain diffusion layer 233 and the source diffusion layer 234 which are formed to a relatively shallow part of the substrate 227. In addition, the silicide layers 235 and 236 are respectively formed on the drain diffusion layer 233 and the source diffusion layer 234 to reduce the resistances of the drain and source, so that a high-speed operation becomes possible.

Figure 28B:
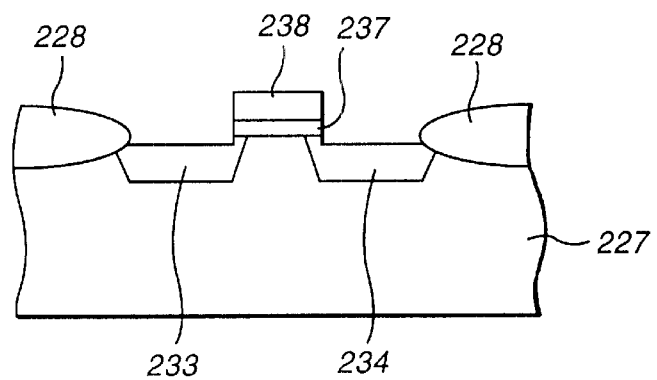

As shown in FIG. 28(b) the input transistor forming the input circuit 220 of the input/output cell 214 of FIG. 25 has the drain diffusion layer 233 and the source diffusion layer 234 thereof which are formed to a relatively shallow part of the substrate, but no silicide layer is formed on the drain and source diffusion layers because the provision of the silicide layer would make the input transistor susceptible to electrostatic destruction. In addition, the input transistor shown in FIG. 28(b) forming the input circuit 226 of the input/output cell 215 is formed similarly to the output transistor shown in FIG. 28(a).

Figure 29:
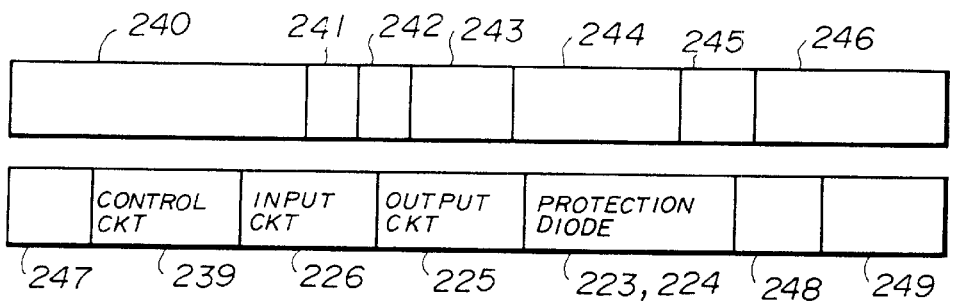
FIGS. 29 and 30 respectively show cases where the input/output cells of the type shown in FIG. 26 are formed in basic cell rows.
Figure 30:
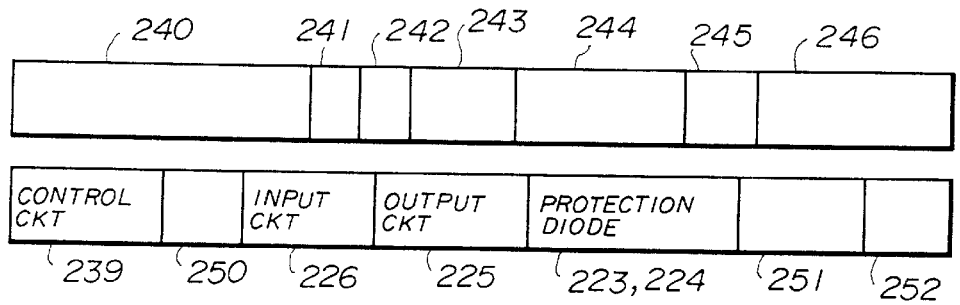
Figure 31:
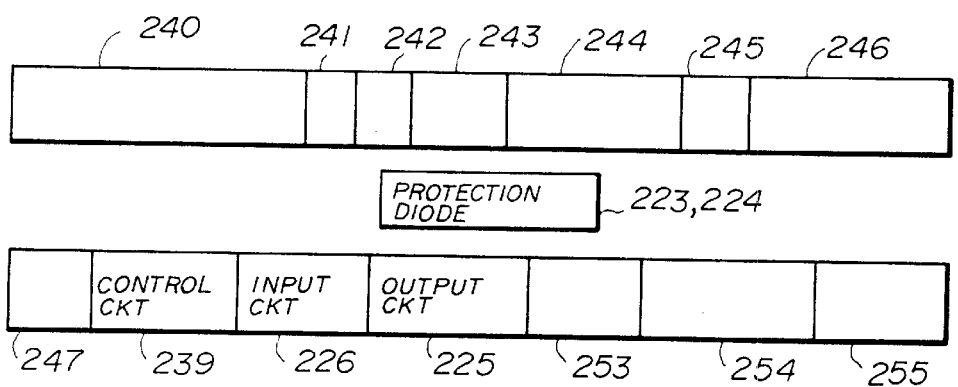
FIG. 31 shows a case where protection diodes of the input/output cell of the type shown in FIG. 26 are formed between the basic cell rows.

FIGS. 29 and 30 show cases where the input/output cells 215 are formed in the basic cell rows. On the other hand, FIG. 31 shows a case where the protection diodes 223 and 224 of the input/output cell 215 are formed between the basic cell rows. Although a control circuit 239 is not shown in FIG. 26, this control circuit 239 is used for the test. Furthermore, in FIGS. 29 through 31, the logic circuits are formed in parts 240 through 255.

A junction diode between the substrate and the drain diffusion layer of the output transistor which forms the output circuit 225 may be used in common as the protection diodes 223 and 224, and it is not essential to provide independent diodes exclusively as the protection diodes 223 and 224. The same can be said of the protection diodes 217 and 218 of the input/output cell 214.

According to this embodiment, the input/output cells 214 which occupy a large area are arranged at the peripheral part on the surface 213 of the LSI chip, and the input/output cells 215 which occupy a relatively small area are arranged at the inner part of the surface 213 of the LSI chip. For this reason, the surface 213 of the LSI chip is effectively utilized, and the deterioration of the integration density of the internal circuit of the LSI chip is minimized.

Although the present invention is applied to the gate array type semiconductor integrated circuit in this embodiment, the present invention can of course be applied to other types of semiconductor integrated circuits.

In addition, although the input/output cells in this embodiment are provided with the input circuit and the output circuit, the present invention can be applied similarly to the case where the input/output cells is only provided with the input circuit or the output circuit.

Next, a description will be given of the pad of the input/output cell of the conventional semiconductor integrated circuit, by referring to FIGS. 8 through 10.

Figure 32:
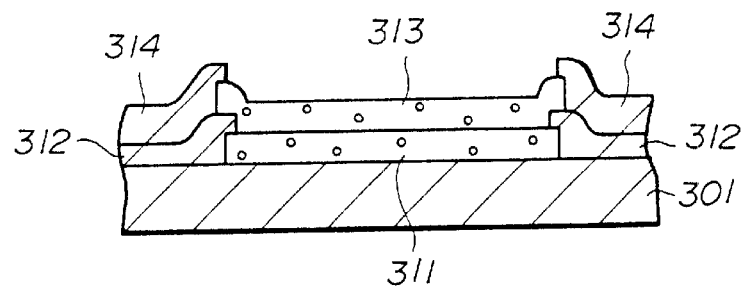
FIG. 32 is a cross sectional view showing a pad part of the conventional semiconductor integrated circuit.

In FIG. 32 which shows a cross section of a pad part of the conventional semiconductor integrated circuit, there are shown a field insulator layer 301, a lower conductor layer 311 which extends on the field insulator layer 301 and used as input/output interconnection, an insulator layer 312, an upper conductor layer 313, and a surface stablizing layer 314.

Figure 33:
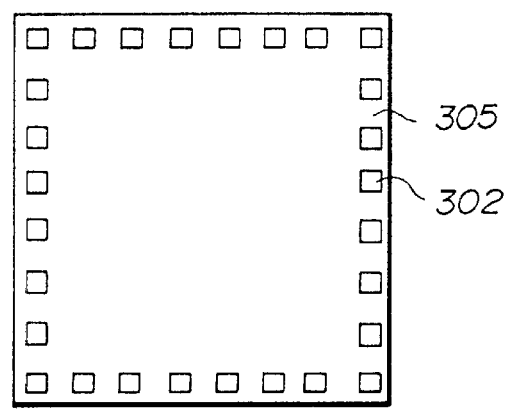
FIG. 33 is a plan view showing an arrangement of pads on the conventional semiconductor integrated circuit.

In the conventional semiconductor integrated circuit, pads 302 such as that shown in FIG. 32 are arranged at the peripheral part of an LSI chip (semiconductor integrated circuit) 305 as shown in FIG. 33.

Figure 34:
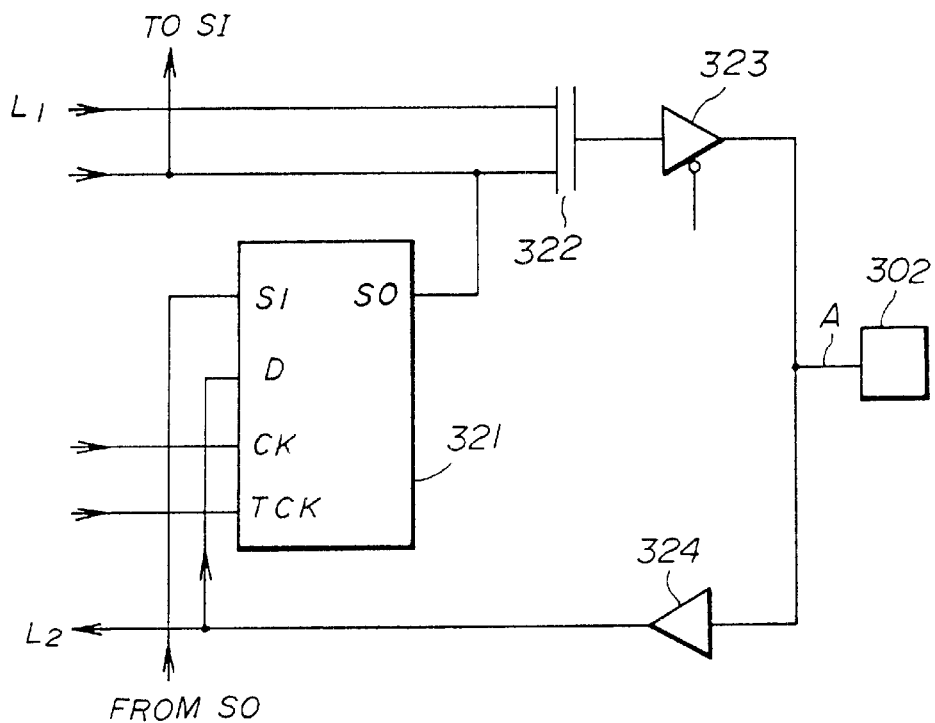
FIG. 34 is a circuit diagram showing a testing circuit conventionally used to test the conventional semiconductor integrated circuit.

A testing circuit having the construction shown in FIG. 34 was conventionally used to test the LSI chip 305. In FIG. 34, the testing circuit includes a boundary scan flip-flop 321, a selector 322, an input circuit 323, and an output circuit 324 which are connected as shown. The boundary scan flip-flop 321 includes a scan-in terminal SI which is connected to a scan-out terminal of a boundary scan flip-flop (not shown) which is provided on one side of the boundary scan flip-flop 321, a scan-out terminal so which is connected to a scan-in terminal of another boundary scan flip-flop (not shown) which is provided on the other side of the boundary scan flip-flop 321, a data terminal D for entering data into this boundary scan flip-flop 321, a terminal CK for inputting a clock signal of a system circuit (not shown), and a clock terminal TCK for testing. The input circuit 323 inputs a signal $L_1$ which is output from a logic circuit (not shown). The output circuit 324 outputs, a signal $L_2$ to the logic circuit.

When testing the functions of the LSI chip using the above testing circuit, it is not essential to contact the probe needles (not shown) to all of the pads 302 as long as the boundary scan chain is established.

However, in order to confirm the conducting state, the short-circuit and the like at a part A shown in FIG. 34, it is necessary to contact the probe needles to all of the pads 302 because the boundary scan chain is established even if a defect exists at this part A.

On the other hand, since it is desirable that a large number of pads 302 are provided on the LSI chip, it is desirable to arrange the pads 302 not only along one peripheral row of the LSI chip but along two or more rows or to distribute the pads 302 throughout the entire surface of the LSI chip.

But as described above, in order to confirm the conducting state, the short-circuit and the like at the part A in FIG. 34, it is necessary to contact the probe needles to all of the pads 302, and for this reason, it is impossible to arrange the pads 302 in a large region of the LSI chip because the probe needles cannot be arranged to accurately contact all of the pads 302 in such a case.

Next, a description will be given of embodiments in which this problem can be eliminated.

A description will be given of a fourth embodiment of the semiconductor integrated circuit according to the present invention, by referring to FIGS. 35 and 36.

Figure 35:
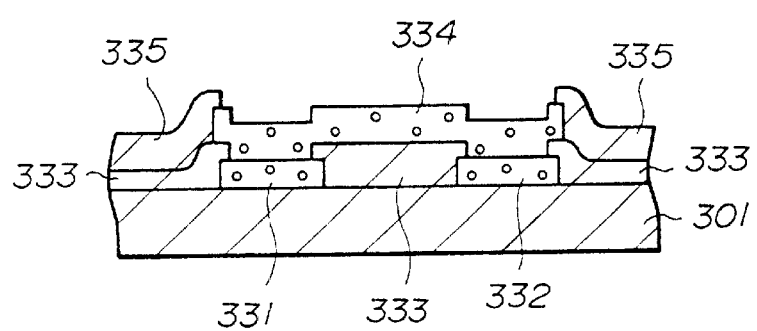
FIG. 35 is a cross sectional view showing the construction of a pad of a fourth embodiment of the semiconductor integrated circuit according to the present invention.

In this embodiment, a pad of the LSI chip (semiconductor integrated circuit) has the construction shown in FIG. 35. In FIG. 35, lower conductor layers 331 and 332 which are respectively connected to mutually different logic circuits are formed on a field insulator layer 301. An upper conductor layer 334 is formed on the lower conductor layers 331 and 332 and an insulator layer 333, and short-circuits the lower conductor layers 331 and 332. A surface stabilizing layer 335 is formed on the surface as shown.

Next, a description will be given of the method of testing the LSI chip having a pad 304 which has the construction shown in FIG. 35, by referring to FIG. 36.

Figure 36:
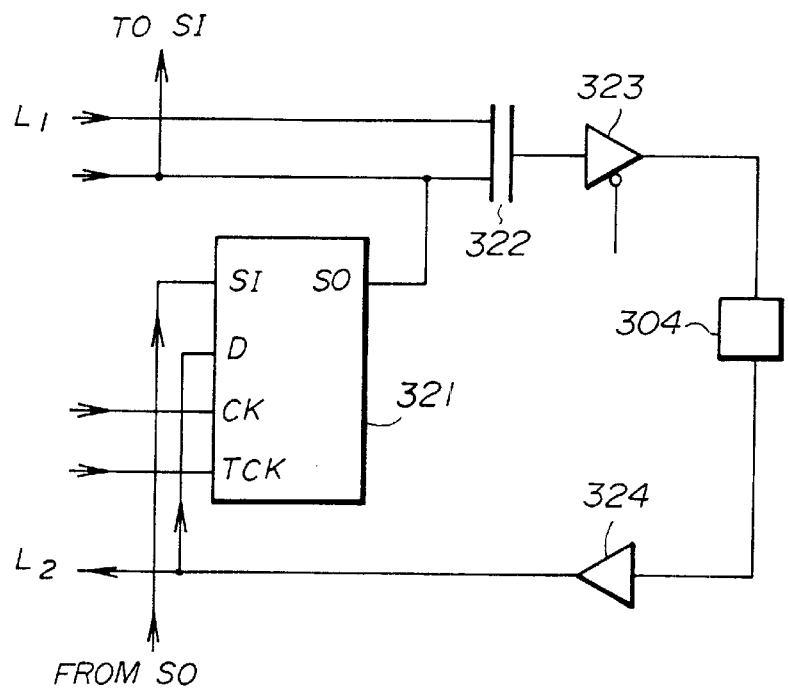
FIG. 36 is a circuit diagram showing a testing circuit used to test the fourth embodiment of the semiconductor integrated circuit.

In FIG. 36, a boundary scan flip-flop 321 includes a scan-in terminal SI which is connected to a scan-out terminal of a boundary scan flip-flop (not shown) which is adjacent to one side of the boundary scan flip-flop 321, a scan-out terminal SO which is connected to a scan-in terminal of a boundary scan flip-flop (not shown) which is adjacent to the other side of the boundary scan flip-flop 321, a data terminal D for entering data into the boundary scan flip-flop 321, a terminal CK for inputting a clock signal of a system circuit, and a clock terminal TCK for testing. A testing circuit shown in FIG. 36 includes this boundary scan flip-flop 321, a selector 322, an input circuit 323, and an output circuit 324 which are connected as shown. The input circuit 323 inputs a signal $L_1$ which is output from a logic circuit (not shown). The output circuit 324 outputs a signal $L_2$ to the logic circuit.

When testing the functions of the LSI chip using the above testing circuit, it is not essential to contact the probe needles (not shown) to all of the pads 304 as long as the boundary scan chain is established.

In addition, because the boundary scan chain is made via the pad 304, no boundary scan chain will be established if a conduction failure, short-circuit or the like exists within the pad 304 or in a region in the vicinity of the pad 304, it is possible to immediately find the conduction failure, short-circuit or the like.

Next, a more detailed description will be given of the testing operation.

First, a data "1" is set in an arbitrary boundary scan flip-flop 321 via the boundary scan chain (terminal SI). Second, when the set data is output via the output circuit 323, the data is input to the boundary scan flip-flop 321 via the pad 304 and the input circuit 324 and the data is entered into the boundary scan flip-flop 321. Third, a data which is next read into the boundary scan flip-flop 321 via the boundary scan chain (terminal SI) is read out by setting a data "0" into the boundary scan flip-flop 321.

In this state, if a disconnection exists within the pad 304 or in the region in the vicinity of the pad 304, the data which is set in the boundary scan flip-flop 321 via the input circuit 324 is fixed to "1" or "0" and will not change, thereby enabling this defect to be found immediately.

According to this embodiment, it is unnecessary to contact the probe needles to all of the pads in order to test the conducting state within the pads or in the regions in the vicinities of the pads. For this reason, it is possible to distribute the pads on the LSI chip with an arbitrary arrangement.

Figure 37A:
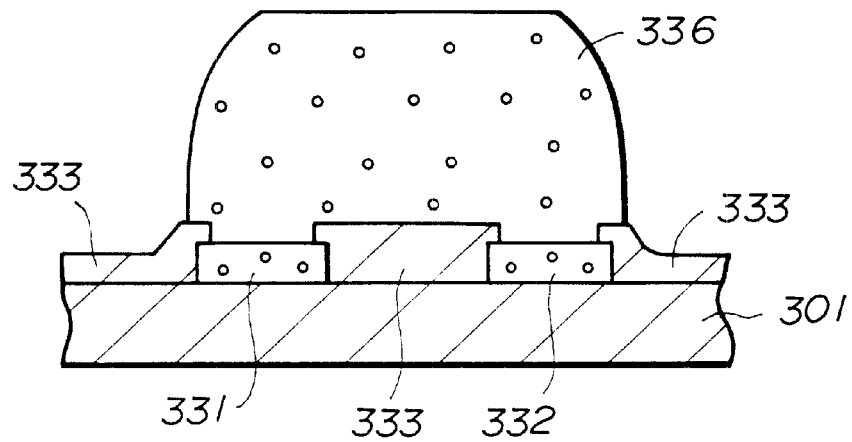
FIGS. 37A and 37B respectively are a cross sectional view and a plan view showing the construction of a pad of a fifth embodiment of the semiconductor integrated circuit according to the present invention.
Figure 37B:
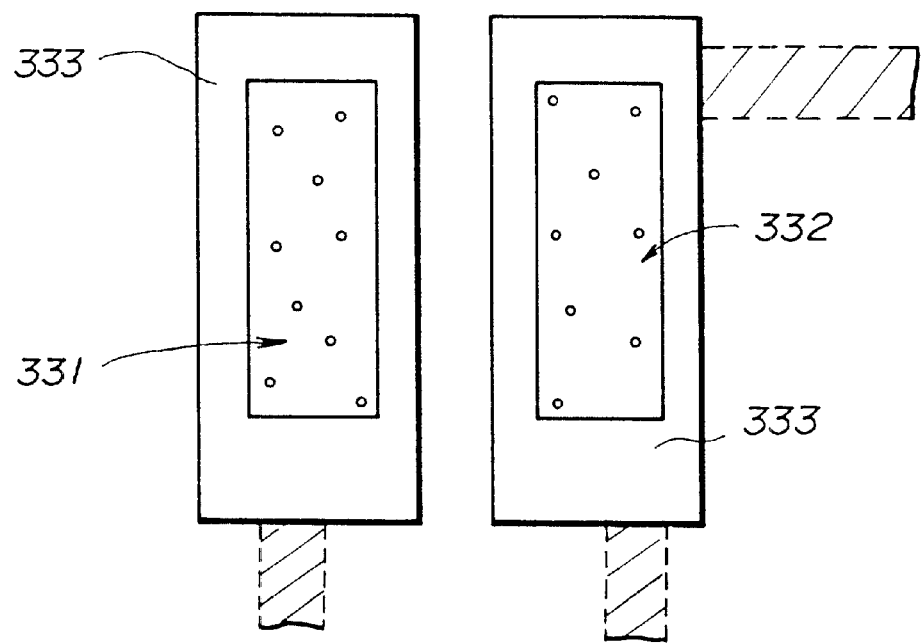

Next, a description will be given of a fifth embodiment of the semiconductor integrated circuit according to the present invention, by referring to FIGS. 37A and 37B. In FIGS. 37A and 37B, those parts which are the same as those corresponding parts in FIG. 35 are designated by the same reference numerals, and a description thereof will be omitted.

In this embodiment, a bump 336 is provided in place of the upper conductor layer 334. Otherwise, this embodiment is the same as the fourth embodiment, and this embodiment functions similarly to the fourth embodiment.

Figure 38:
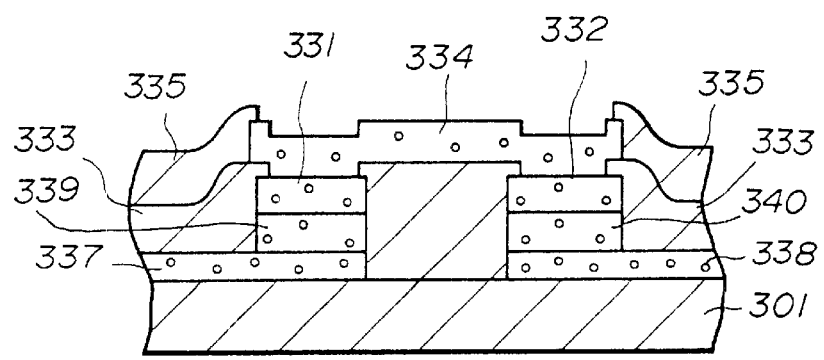
FIG. 38 is a cross sectional view showing the construction of a pad of a sixth embodiment of the semiconductor integrated circuit according to the present invention.

Next, a description will be given of a sixth embodiment of the semiconductor integrated circuit according to the present invention, by referring to FIG. 38. In FIG. 38, those parts which are the same as those corresponding parts in FIG. 35 are designated by the same reference numerals, and a description thereof will be omitted.

In this embodiment, interconnections 337, 338, 339 and 340 are respectively connected to mutually different logic circuits. Hence, it is possible to selectively input external signals to a plurality of logic circuits and also selectively output signals from the plurality of logic circuits. Otherwise, this embodiment is the same as the fourth embodiment, and this embodiment functions similarly to the fourth embodiment.

Next, a description will be given of a seventh embodiment of the semiconductor integrated circuit according to the present invention, by referring to FIG. 39.

In this embodiment, the probe needles do not need to contact all of the pads 304 due to the construction of each pad 304. Hence, the intervals of the pads 304 is freely selected as long as the bonding is possible, and the pads 304 are arbitrarily arranged on the LSI chip 305 as shown in FIG. 39.

Figure 39:
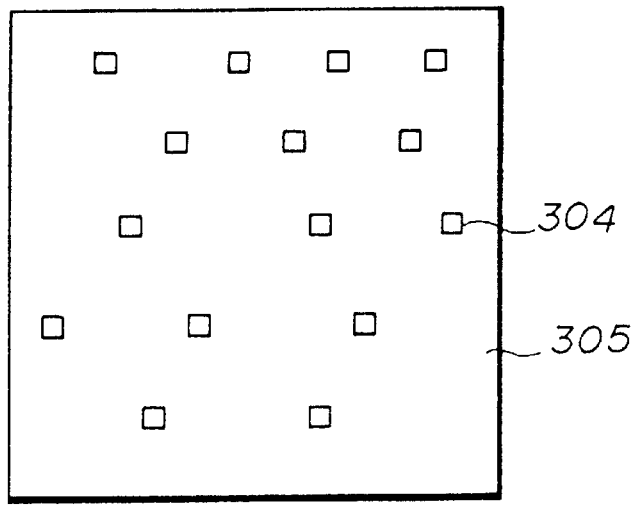
FIG. 39 is a plan view showing an arrangement of pads of a seventh embodiment of the semiconductor integrated circuit according to the present invention.

Next, a description will be given of an eighth embodiment of the semiconductor integrated circuit according to the present invention, by referring to FIG. 40, In FIG. 40, those parts which are the same as those corresponding parts in FIG. 39 are designated by the same reference numerals, and a description thereof will be omitted.

Figure 40:
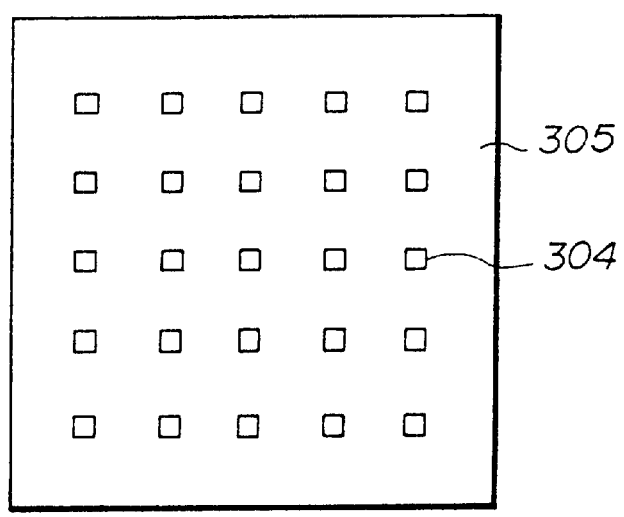
FIG. 40 is a plan view showing an arrangement of pads of an eighth embodiment of the semiconductor integrated circuit according to the present invention.

In this embodiment, the pads 304 are arranged in a matrix arrangement as shown in FIG. 40.

Figure 41:
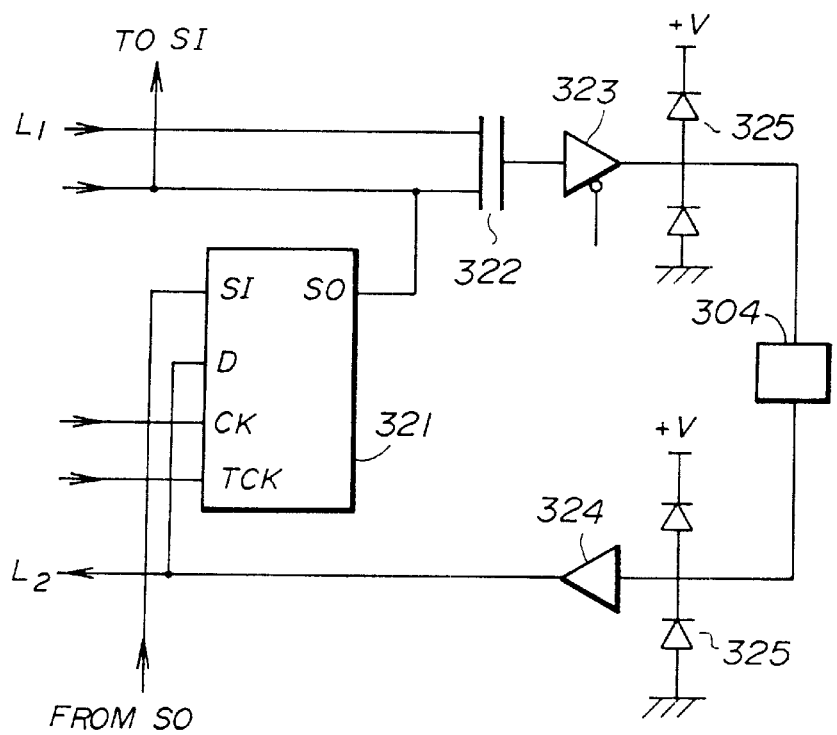
FIG. 41 is a circuit diagram showing an essential part of a ninth embodiment of the semiconductor integrated circuit according to the present invention.

Next, a description will be given of a ninth embodiment of the semiconductor integrated circuit according to the present invention, by referring to FIG. 41. In FIG. 41, those parts which are the same as those corresponding parts in FIG. 36 are designated by the same reference numerals, and a description thereof will be omitted.

In this embodiment, a protection circuit 325 is connected between the input circuit 323 and the pad 304, and between the output circuit 324 and the pad 304. Each protection circuit 325 is provided to protect the logic circuit and the like from external noise. Of course, the probe needles do not need to contact all of the pads 304 of this embodiment, and the pads 304 may be arranged as in the sixth and seventh embodiments described above.

Further, the present invention is not limited to these embodiments, but various variations and modifications may be made without departing from the scope of the present invention.

What is claimed is:

1. A semiconductor integrated circuit comprising:
a semiconductor chip body;
a plurality of input/output cells arranged on a surface of said semiconductor chip body at parts including a peripheral part and a central part of said semiconductor chip body,
each of said input/output cells including a pad and a holding part coupled to the pad for holding incoming data; and
at least an internal logic circuit provided on said semiconductor chip body;
wherein the plurality of said holding parts of input/output cells arranged at both the peripheral part and the central part of said chip body are coupled in series in a test mode to form a scan path circuit,
wherein an input/output cell which has a pad for receiving an external test signal in a test mode is arranged at the peripheral part of said semiconductor chip body, and
wherein test data held in the holding part of an input/output cell which is arranged at a part other than the peripheral part of said semiconductor chip body is supplied from the input/output cell which receives the external test signal and is arranged at the peripheral part of the semiconductor chip body via the scan path circuit.

2. The semiconductor integrated circuit as claimed in claim 1, wherein said semiconductor chip body includes a substrate, and the semiconductor integrated circuit further comprises a pair of lower conductor layers formed on the substrate and coupled to mutually different logic circuits within the semiconductor integrated circuit, and an upper conductor layer which is formed on the pair of lower conductor layers to short-circuit the pair of lower conductor layers, said upper conductor layer forming the pad of the input/output cell.

3. The semiconductor integrated circuit as claimed in claim 2, wherein the upper conductor layer is formed as a bump.

4. The semiconductor integrated circuit as claimed in claim 2, which further comprises a plurality of input/output interconnections connected to the upper conductor layer.

5. The semiconductor integrated circuit as claimed in claim 2, wherein the pads of the input/output cells are distributed with an arbitrary arrangement on the surface of said semiconductor chip body.

6. The semiconductor integrated circuit as claimed in claim 2, wherein the pads of the input/output cells are arranged in a matrix arrangement on the surface of said semiconductor chip body.

7. The semiconductor integrated circuit as claimed in claim 1, wherein predetermined ones of said input/output cells having the pads for receiving an external signal and outputting a signal outside the semiconductor integrated circuit are arranged in the peripheral part of said semiconductor chip body.

8. The semiconductor integrated circuit as claimed in claim 7, wherein said predetermined input/output cells are coupled to the scan path circuit.

9. The semiconductor integrated circuit as claimed in claim 7, wherein the scan path circuit formed by the holding parts is a boundary scan circuit.

10. The semiconductor integrated circuit as claimed in claim 7, wherein the scan path circuit formed by the holding parts is an internal scan circuit.

11. The semiconductor integrated circuit as claimed in claim 7, wherein the holding parts which are coupled to form the scan path circuit include a first shift register for shifting the test data which is received from the input/output cell having the pad for receiving the external test signal in the test mode.

12. The semiconductor integrated circuit as claimed in claim 11, wherein the holding parts which are coupled to form the scan path circuit further include latch circuits for latching output data received from corresponding stages of said first shift register and for supplying the data in parallel to the pads of the input/output cells which are arranged in the central part of said semiconductor chip body, and a second shift register set with signals received from the pads of the input/output cells which are arranged in the central part of said semiconductor chip body at corresponding stages thereof and shifting the signals so as to serially output a signal from the pad of an input/output cell which is arranged in the peripheral part of said semiconductor chip body.

13. The semiconductor integrated circuit as claimed in claim 11, wherein the pads of said input/output cells are arranged throughout the entire surface of said semiconductor chip body.

14. The semiconductor integrated circuit as claimed in claim 7, wherein first input/output cells are arranged in the peripheral part of said semiconductor chip body, second input/output cells are arranged in the central part of said semiconductor chip body, each first input/output cell is used for a data transfer between the semiconductor integrated circuit and another semiconductor integrated circuit which is independent from said semiconductor chip body, and each second input/output cell is primarily used for a data transfer within the semiconductor integrated circuit.

15. The semiconductor integrated circuit as claimed in claim 14, wherein the first and second input/output cells respectively include a protection diode which is coupled between the pad thereof and the internal logic circuit, and the protection diode of the first input/output cell occupies an area on the surface of said semiconductor chip body greater than the area occupied by the protection diode of the second input/output cell.

16. The semiconductor integrated circuit as claimed in claim 14, wherein the first input/output cell includes an input transistor having a gate, and an input protection resistor which is coupled in series between the gate of the input transistor and the pad of the first input/output cell.

17. The semiconductor integrated circuit as claimed in claim 14, wherein the first and second input/output cells respectively include an output transistor, and the output transistor of the first input/output cell has a size greater than that of the output transistor of the second input/output cell.

18. The semiconductor integrated circuit as claimed in claim 17, wherein depths of drain and source diffusion layers of the output transistor of the first input/output cell is greater than that of drain and source diffusion layers of the output transistor of the second input/output cell.

19. The semiconductor integrated circuit as claimed in claim 18, wherein the drain and source diffusion layers of the output transistor of the first input/output cell have a non-silicide surface, and the drain and source diffusion layers of the output transistor of the second input/output cell have a silicide surface.

20. The semiconductor integrated circuit as claimed in claim 14, which further comprises rows of basic cells arranged on the surface of said semiconductor chip body, and the second input/output cells are arranged in the rows of the basic cells.

21. The semiconductor integrated circuit as claimed in claim 20, wherein the second input/output cell includes a protection diode which is coupled between the pad thereof and the internal logic circuit, and each protection diode is formed between the rows of the basic cells.

22. The semiconductor integrated circuit as claimed in claim 20, wherein the second input/output cell includes a protection diode which is coupled between the pad thereof and the internal logic circuit, and each protection diode is formed between the rows of the basic cells and in the rows of the basic cells.

23. A semiconductor integrated circuit comprising:
a semiconductor chip body including a substrate;
a plurality of input/output cells arranged in a surface of said semiconductor chip body at parts including a peripheral part and a central part of said semiconductor chip body, each of said input/output cells including a pad and holding means coupled to the pad for holding incoming data;
at least an internal logic circuit provided on said semiconductor chip body;
a pair of lower conductor layers formed on the substrate and coupled to mutually different logic circuits within the semiconductor integrated circuit; and
an upper conductor layer which is formed on the pair of lower conductor layers to short-circuit the pair of lower conductor layers, said upper conductor layer forming the pad of the input/output cell,
wherein a plurality of said holding means of input/output cells arranged at both the peripheral part and the central part of said chip body are coupled in series in a test mode to form a scan path circuit,
wherein an input/output cell which has a pad for receiving an external test signal in a test mode is arranged at the peripheral part of said semiconductor chip body,
wherein test data held in the holding means of an input/output cell which is arranged at a part other than the peripheral part of said semiconductor chip body is supplied from the input/output cell which receives the external test signal and is arranged at the peripheral part of the semiconductor chip body via the scan path circuit, and
wherein each input/output cell includes an input circuit coupled to the pad thereof, an output circuit coupled to the pad thereof, and a pair of protection circuits respectively coupled between the pad and the input and output circuits, said input circuit and one of said protection circuits are connected to one of said lower conductor layers, and said output circuit and the other of said protection circuits are connected to the other of said lower conductor layers.

24. A semiconductor integrated circuit comprising:
a semiconductor chip body;
a plurality of input/output cells arranged on a surface of said semiconductor chip body; and
at least an internal logic circuit provided on said semiconductor chip body,
wherein said input/output cells include first input/output cells which are arranged in a peripheral part of said semiconductor chip body and second input/output cells which are arranged in a central part of said semiconductor chip body,
wherein each first input/output cell is used for a data transfer between the semiconductor integrated circuit and another semiconductor integrated circuit which is independent from said semiconductor chip body,
wherein each second input/output cell is primarily used for a data transfer within the semiconductor integrated circuit,
wherein each of said input/output cells include a pad and a holding part coupled to the pad for holding incoming data,
wherein the plurality of said holding parts of input/output cells arranged at both the peripheral part and the central part of said chip body are coupled in series in a test mode to form a scan path circuit,
wherein an input/output cell which has a pad for receiving an external test signal in a test mode is arranged at the peripheral part of said semiconductor chip body, and
wherein test data held in the holding part of an input/output cell which is arranged at a part other than the peripheral part of said semiconductor chip body is supplied from the input/output cell which receives the external test signal and is arranged at the peripheral part of the semiconductor chip body via the scan path circuit.

25. The semiconductor integrated circuit as claimed in claim 24, wherein the first and second input/output cells respectively include a protection diode which is coupled between the pad thereof and the internal logic circuit, and the protection diode of the first input/output cell occupies an area on the surface of said semiconductor chip body greater than the area occupied by the protection diode of the second input/output cell.

26. The semiconductor integrated circuit as claimed in claim 24, wherein the first input/output cell includes an input transistor having a gate, and an input protection resistor which is coupled in series between the gate of the input transistor and the pad of the first input/output cell.

27. The semiconductor integrated circuit as claimed in claim 24, wherein the first and second input/output cells respectively include an output transistor, and the output transistor of the first input/output cell has a size greater than that of the output transistor of the second input/output cell.

28. The semiconductor integrated circuit as claimed in claim 26, wherein depths of drain and source diffusion layers of the output transistor of the first input/output cell is greater than that of drain and source diffusion layers of the output transistor of the second input/output cell.

29. The semiconductor integrated circuit as claimed in claim 28, wherein the drain and source diffusion layers of the output transistor of the first input/output cell have a non-silicide surface, and the drain and source diffusion layers of the output transistor of the second input/output cell have a silicide surface.

30. The semiconductor integrated circuit as claimed in claim 24, which further comprises rows of basic cells arranged on the surface of said semiconductor chip body, and the second input/output cells are arranged in the rows of the basic cells.

31. The semiconductor integrated circuit as claimed in claim 30, wherein the second input/output cell includes a protection diode which is coupled between the pad thereof and the internal logic circuit, and each protection diode is formed between the rows of the basic cells.

32. The semiconductor integrated circuit as claimed in claim 30, wherein the second input/output cell includes a protection diode which is coupled between the pad thereof and the internal logic circuit, and each protection diode is formed between the rows of the basic cells and in the rows of the basic cells.

* * * * *